(12) United States Patent
Nishimoto et al.

(10) Patent No.: US 6,338,757 B1
(45) Date of Patent: Jan. 15, 2002

(54) SINGLE CRYSTAL PULL-UP APPARATUS

(75) Inventors: Manabu Nishimoto, Amagasaki; Masahiko Okui, Sanda; Takayuki Kubo, Nishinomiya; Shingo Kizaki, Hirakata; Junji Horii, Amagasaki, all of (JP)

(73) Assignee: Sumitomo Metal Industries, Ltd., Osaka (JP)

( * ) Notice: Subject to any disclaimer, the term of this patent is extended or adjusted under 35 U.S.C. 154(b) by 0 days.

(21) Appl. No.: 09/582,918

(22) PCT Filed: Jan. 22, 1999

(86) PCT No.: PCT/JP99/00227

§ 371 Date: Jul. 7, 2000

§ 102(e) Date: Jul. 7, 2000

(87) PCT Pub. No.: WO99/37833

PCT Pub. Date: Jul. 29, 1999

(30) Foreign Application Priority Data

Jan. 22, 1998 (JP) .............................. 10-10351

(51) Int. Cl.[7] .............................................. C30B 35/00
(52) U.S. Cl. ...................... 117/218; 117/200; 117/208; 117/217; 117/222; 117/900
(58) Field of Search ................................ 117/200, 208, 117/217, 218, 222, 900

(56) References Cited

U.S. PATENT DOCUMENTS 5,450,814 A * 9/1995 Shiraishi et al. ............ 117/217
5,476,065 A * 12/1995 Ikezawa et al. ............. 117/217
5,900,059 A * 5/1999 Shimanuki et al. ......... 117/217
6,146,459 A * 11/2000 Park ........................... 117/217

FOREIGN PATENT DOCUMENTS

| JP | 57-40119 | 8/1982 |
| JP | 1-160891 | 6/1989 |
| JP | 3-295892 | 12/1991 |
| JP | 7-41384 | 2/1995 |
| JP | 7-61889 | 3/1995 |
| JP | 7-69779 | 3/1995 |
| JP | 9-255480 | 9/1997 |
| JP | 9-309789 | 12/1997 |

* cited by examiner

Primary Examiner—Felisa Hiteshew
(74) Attorney, Agent, or Firm—Wenderoth, Lind & Ponack, L.L.P.

(57) ABSTRACT

The present invention was achieved in order to provide an apparatus for pulling a single crystal with which a single crystal having a low density of grown-in defects called infrared scatterers, dislocation clusters or the like can be grown. In the apparatus for pulling a single crystal having a crucible to be charged with a melt, a heater arranged around the crucible, a straightening vane in the shape of a side surface of an inverted truncated cone or a cylinder surrounding a pulled single crystal and a heat shield plate for inhibiting the radiant heat from diverging upward in the chamber from the side surface of the pulled single crystal located in the vicinity of the melt surface are arranged.

17 Claims, 37 Drawing Sheets

Low Grow-in
Defect Density Region  45

Grow-in
Defect-free Region  46

SINGLE CRYSTAL PULL-UP APPARATUS

TECHNICAL FIELD

The present invention relates to an apparatus for pulling a single crystal and, more particularly, to an apparatus for pulling a single crystal with which a silicon single crystal used as a semiconductor material is pulled in its low defect density state.

BACKGROUND ART

There are various methods for growing a single crystal, and one of them is a single crystal growth method called the Czochralski method (hereinafter, referred to as the CZ method). FIG. 1 is a diagrammatic sectional view of an apparatus for pulling a single crystal used for the CZ method, and in the figure, reference numeral 1 represents a crucible.

The crucible 1 comprises a bottomed cylindrical quartz crucible 1a and a bottomed cylindrical graphite crucible 1b fitted on the outer side of the quartz crucible 1a. The crucible 1 is supported with a support shaft 8 which rotates in the direction shown by the arrow in the figure at a prescribed speed. A heater 2 of a resistance heating type and a heat insulating mold 7 arranged around the heater 2 are concentrically arranged around the crucible 1. The crucible 1 is charged with a melt 3 of a material for forming a crystal which is melted by the heater 2. On the central axis of the crucible 1, a pulling axis 4 made of a pulling rod or wire is suspended, and at the front thereof, a seed crystal 5 is held by a holder 4a. These parts are arranged within a water cooled type chamber 9 wherein pressure can be controlled.

A method for pulling a single crystal 6 using the above-described apparatus for pulling a single crystal is described below. By reducing the pressure in the chamber 9 and introducing an inert gas thereto, the atmosphere in the chamber 9 is made to be an inert gas atmosphere under reduced pressure. Then, the material for forming a crystal is melted by the heater 2 and is left standing for a period of time so as to release gas in the melt 3 sufficiently.

While the pulling axis 4 is rotated on the same axis in the reverse direction of the support shaft 8 at a prescribed speed, the seed crystal 5 held by the holder 4a is caused to descend and is brought into contact with the melt 3 so as to make the seed crystal 5 partially melt into the melt 3. Then, the single crystal 6 is grown at the lower end of the seed crystal 5.

In growing the single crystal 6, the seed-narrowing (6a) is conducted in order to make the single crystal 6 dislocation-free. Then, a shoulder portion 6b is grown so as to obtain the single crystal 6 having a required diameter in a body portion 6c. When the diameter of the single crystal 6 becomes a required one, the shoulder formation is finished. While the diameter is kept uniform, the body portion 6c is grown. After the body portion 6c is grown to a prescribed length, the tail-narrowing is conducted in order to separate the single crystal 6 from the melt 3 in the dislocation-free state. Then, the single crystal 6 separated from the melt 3 is cooled under prescribed conditions. Wafers manufactured by processing the single crystal 6 thus obtained are used as a substrate material of various semiconductor devices.

In the silicon single crystal pulled through the above steps, defects called infrared scatterers (COP and FPD), dislocation clusters or the like sometimes exist. These defects are not newly formed within the crystal by the later heat treatment. They are already formed during crystal pulling, which are also called grown-in defects.

FIG. 2 is a diagram showing the general relation between the pulling speeds during single crystal growth and occurrence positions of crystal defects. As is shown in FIG. 2, infrared scatterers 21 among the grown-in defects observed in the evaluation after crystal growth are detected inside a ring region of oxidation-induced stacking fault (OSF) 22, a kind of thermally-induced defect. Defects called dislocation clusters 24 among the grown-in defects are detected outside the ring region 22. And a defect-free region 23 exists close to the outside of the ring region (R-OSF) 22. The occurrence region of the ring region (R-OSF) 22 depends on the pulling speed during single crystal growth. As the pulling speed is made lower, the region wherein the ring region (R-OSF) 22 appears shrinks inward from the outer side of the crystal.

The above OSF is an interstitial dislocation loop which occurs during oxidative heat treatment. When the OSF is generated and grows on a wafer surface which is an active region of a device, it causes a leakage current, so that it becomes a defect which deteriorates device properties. Therefore, hitherto, the high-density region of OSF is push out toward the perimeter of the crystal by controlling the position of the R-OSF so as to move toward the perimeter thereof during single crystal growth.

However, recently, the adverse effects of the OSF on devices are controlled since the device manufacturing process is conducted at lower temperatures and a crystal contains less oxygen. Therefore, the OSF is inconsiderable as a factor which deteriorates the device properties. On the other hand, the infrared scatterers among the grown-in defects are a factor which deteriorates the time zero dielectric breakdown, and the dislocation clusters are a factor which remarkably deteriorates the device properties. Recently it is an important problem to reduce the density of those grown-in defects within a crystal.

Accordingly, it is attempted to obtain high-quality devices by utilizing the region wherein almost no defects to deteriorate the device properties are detected, or, the defect-free region existing close to the inside or outside of the ring region (R-OSF) 22. But since the above defect-free region is a very limited region, it is difficult to utilize it effectively. In order to deal with these problems, some methods were proposed.

For example, in Japanese Patent Laid-Open No. 08-330316, it is disclosed that a crystal wherein only the outside region of a ring region (R-OSF) 22 spreads all over the surface thereof can be grown by improving the crystal growth conditions so as to generate no dislocation clusters. However, there is a possibility to achieve this only with a very limited crystal growth condition, or, only by controlling the pulling speed within a very limited range to a certain temperature gradient. It is an extremely severe condition in the silicon single crystal growth wherein a crystal will have a larger and larger diameter and mass production thereof is required.

In Japanese Patent Laid-Open No. 07-257991, and Journal of Crystal Growth, 151 (1995) pp.273–277, it is disclosed that the outside region of a R-OSF can be generated by making the temperature gradient in the pulling axis direction large and pulling a single crystal at a high speed so as to annihilate the R-OSF on the inside of the crystal. However, reduction of grown-in defects within a crystal plane is not considered at all. Even if the R-OSF is caused to shrink inward, dislocation clusters exist in the outside region of the R-OSF as before. Since the dislocation clusters greatly deteriorate the device properties, it cannot be said that high-quality wafers are provided.

DISCLOSURE OF INVENTION

The present invention was developed in order to solve the above problems, and it is an object to provide an apparatus for pulling a single crystal with which a single crystal having a low density of grown-in defects called infrared scatterers, dislocation clusters or the like can be grown.

The present inventors examined the occurrence situation of dislocation clusters to the R-OSF occurrence position within a single crystal grown with conventional conditions or a single crystal wafer and the width thereof. In order to make clear the R-OSF occurrence position within a wafer surface, the distance from the center of the crystal (wafer) to the perimeter (or, the crystal radius) is represented by R, while the R-OSF occurrence position in the radial direction within the crystal is represented by r. For example, when the R-OSF occurs in the center of the crystal, r equals 0. When it occurs on the perimeter of the crystal, r equals R. Here, the R-OSF occurrence position is the position of the inner diameter thereof.

FIG. 3 is a graph indicating the occurrence situation of dislocation clusters based on the relationship between the width of an R-OSF in a single crystal grown with conventional conditions and occurrence position thereof. Here, the width (%) of the R-OSF is shown by the proportion of the length to the radius of the grown crystal. In FIG. 4, the defect distribution within a wafer surface where the R-OSF occurrence position r is (2/3) R is diagrammatically shown.

From the results shown in FIG. 3, it is found that the width of the R-OSF under the conventional growth conditions is 8% of the crystal radius at a maximum, and that dislocation clusters are generated without exception when the R-OSF occurrence position r is (2/3)R or less. In other words, when the width of the R-OSF becomes larger, there is supposedly a possibility that a crystal having no occurrence of dislocation clusters can be grown even if the R-OSF occurrence position r is made smaller (in order to make the occurrence region of infrared scatterers smaller), for example, r≦(2/3) R.

As is described below in detail in the BEST MODE FOR CARRYING OUT THE INVENTION, FIG. 5 is a graph indicating the occurrence situation of dislocation clusters based on the relationship between the width of an R-OSF and occurrence position thereof in a crystal having a diameter of 8 inches obtained by carrying out an embodiment of the present invention. This proves the above supposition.

FIG. 6 is a diagram showing the relationship between the concentration distribution of vacancy taken inside a plane of a crystal grown with conventional conditions and width of a R-OSF to be generated. In the figure, the axis of ordinates shows the vacancy concentration, while the axis of abscissas shows the position within the crystal plane.

As is shown in FIG. 6, the width of the R-OSF 22 within a conventional crystal plane is 8% or less of the crystal radius. This suggests that the region where the R-OSF 22 occurs is only the region corresponding with the part having vacancy concentrations 31 within a limited range, and that the range corresponding with the vacancy concentrations 31 is within the range of 8% of the crystal radius. In the figure, reference numeral 32 represents vacancy concentrations in the range to be a defect-free region.

In a generally pulled crystal, the temperature gradient varies in the pulling axis direction within a plane. As is shown in FIG. 7(a), since the temperature in the outer region becomes low sooner, the temperature gradient (G) becomes larger in the outer region. When the temperature gradient becomes larger, the amount of vacancy taken inside the crystal which diffuses toward the solid-liquid interface in the pulling axis direction and disappears becomes larger and the concentration of the vacancy kept in the crystal becomes lower. Since the amount of vacancy in the outer region of the crystal which diffuses outward in the crystal radial direction is larger than that in the crystal center portion, the vacancy concentration in the crystal outer region is lowered more easily. Thus, the concentration of vacancy taken inside the crystal plane is not uniform. The concentration lowers nearer the crystal perimeter.

Under the conventional growth conditions, since the vacancy concentration within the crystal plane is not uniform and greatly lowers nearer the crystal perimeter, the region wherein the vacancy concentrations in which the R-OSF occurs correspond with the vacancy concentrations within the crystal plane is small, which is within the range of 8% of the crystal radius. As a result, hitherto, the width of the R-OSF is held down to 8% or less of the radius of the grown crystal.

It is ascertained that the R-OSF occurrence region is determined by the crystal pulling speed and the temperature region of the hottest portion (the melting point to 1200° C.) during crystal pulling, and is affected by the thermal history in the hottest portion during pulling.

From the above contents, the present inventors found out that the width of the R-OSF 22 can be increased by controlling the thermal history of the hottest portion (the melting point to 1200° C.) of the crystal during crystal pulling so as to make the then temperature gradient in the outer region within the crystal plane equivalent to (see FIG. 7(b)), or less than that in the center portion (see FIG. 7(c)) to enlarge the region of the vacancy concentration range wherein the R-OSF is generated (see FIG. 8). FIGS. 7(a)–7(c) are diagrams showing the relationship between the position within a crystal plane and temperature distribution. FIG. 8 is a diagram showing the relationship between the concentration distribution of vacancy taken inside a plane of a grown crystal and width of an R-OSF to be generated when the region of the vacancy concentration range wherein the R-OSF is generated is enlarged.

The main heat flows on the side surface of the crystal in the hottest portion thereof are heat input from the heater and heat radiation to the chamber. Therefore, in order to make the temperature gradient in the crystal outer region smaller, it is necessary to make the heat input from the heater larger, to make the heat radiation to the chamber smaller, or to conduct both of these. In the present invention, concerning the heat flows, the temperature gradient is regulated mainly by making the heat radiation to the chamber smaller.

In accordance with a first aspect of the present invention, provided is an apparatus for pulling a single crystal having a crucible to be charged with a melt, a heater arranged around the crucible, a straightening vane in the shape of a side surface of an inverted truncated cone or a cylinder surrounding a pulled single crystal and the like, wherein the lower end portion of the straightening vane is located above the surface of the melt to be filled in the crucible, characterized by a ring-shaped heat shield plate being fitted to, or being arranged off the inner or outer wall surface of the straightening vane at a position higher than the lower end portion of the straightening vane.

Using this apparatus for pulling a single crystal, the heat radiation to the chamber from the outer region of the single crystal in the hottest portion can be reduced, so that the temperature gradient in the outer region of the pulled single crystal can be made equivalent to or less than that in the crystal center portion. By enlarging the region of the vacancy concentration range wherein an R-OSF is generated, the width of the R-OSF can be increased. Therefore, by shrinking the occurrence position of the R-OSF and increasing the width thereof, a single crystal having a low defect density can be grown. In addition, since the ring-shaped heat shield plate can be fitted by simply mounting it on the straightening vane, the heat shield plate can be easily arranged.

In accordance with a second aspect of the present invention, provided is an apparatus for pulling a single crystal according to the first aspect of the present invention characterized by the distance between the melt surface and the bottom surface of the heat shield plate being within the range of 30 mm–200 mm.

Using the apparatus for pulling a single crystal in accordance with the second aspect, inhibiting the radiant heat from diverging upward from the side surface of a pulled single crystal located in the vicinity of the melt surface and inhibiting the radiant heat from diverging upward from the melt surface and the upper portion of the crucible can be effectively conducted with the heat shield plate.

In accordance with a third aspect of the present invention, provided is an apparatus for pulling a single crystal according to the first or second aspects of present invention characterized by a heat insulator being embedded in the upper portion of the straightening vane above the position where the heat shield plate is arranged in the apparatus.

Using the apparatus for pulling a single crystal in accordance with third aspect, the whole temperature gradient in the pulling axis direction can be made larger by the heat insulator embedded in the straightening vane. When the temperature gradient in the pulling axis direction in the whole single crystal becomes larger, the diffusion rate of the vacancy taken inside the crystal toward the solid-liquid interface becomes higher, so that it becomes difficult to secure the region wherein the vacancy concentration in which an R-OSF occurs and the vacancy concentration within the crystal plane are coincident with each other at usual pulling speeds. In order to hold the diffusion rate down, the pulling speed can be increased. Therefore, the production efficiency of single crystals can be improved. In order to maintain the heat input from the heater large, the heat insulator is not embedded in the lower portion of the straightening vane. Here, by making the lower portion of the straightening vane of quartz, the heat input from the heater can be further increased.

In accordance with a fourth aspect of the present invention, provided is an apparatus for pulling a single crystal according to any of the first to third aspects of the present invention characterized by the inner diameter of the heat shield plate being larger than the outer diameter of a single crystal to be pulled when the heat shield plate is on the inner surface side of the straightening vane.

Using the apparatus for pulling a single crystal in accordance with the fourth aspect, the heat shield plate can be arranged in a desired position without being an obstacle to the single crystal.

In accordance with a fifth aspect of the present invention, provided is an apparatus for pulling a single crystal according to any of the first to third aspects of the present invention characterized by the outer diameter of the heat shield plate being smaller than the inner diameter of the crucible to be charged with a melt when the heat shield plate is on the outer surface side of the straightening vane.

Using the apparatus for pulling a single crystal in accordance with the fifth aspect, the heat shield plate can be arranged in a desired position without being an obstacle to the crucible.

In accordance with a sixth aspect of the present invention, provided is an apparatus for pulling a single crystal according to any of the first to fifth aspects of the present invention characterized by having a cooling tube surrounding a single crystal pulled above the straightening vane.

Using the apparatus for pulling a single crystal in accordance with the sixth aspect, the whole temperature gradient in the pulling axis direction of the single crystal can be made larger by arranging the cooling tube in a prescribed position. When the temperature gradient in the whole single crystal becomes larger, the diffusion rate of the vacancy taken inside the crystal toward the solid-liquid interface becomes higher. In order to secure the region wherein the vacancy concentration in which an R-OSF occurs and the vacancy concentration within the crystal plane are coincident with each other so as to hold the diffusion rate down, the pulling speed can be increased. Therefore, the production efficiency of single crystals can be further improved.

In accordance with a seventh aspect of the present invention, provided is an apparatus for pulling a single crystal according to any of the first to sixth aspects of the present invention characterized by having the lower portion of the straightening vane widen toward the lower end, and providing a flection thereof located below the fitting position of the heat shield plate.

Using the apparatus for pulling a single crystal in accordance with the seventh aspect, since the inside of the lower portion of the straightening vane is effectively heated from the melt surface which is a rather hot portion in the crucible, the heat input to the outer surface of the single crystal facing the inside of the lower portion of the straightening vane can be increased. As a result, more certainly, the temperature gradient in the outer region of the single crystal can be made equivalent to or less than that in the center portion thereof.

In accordance with an eighth aspect of the present invention, provided is an apparatus for pulling a single crystal according to the seventh aspect of the present invention characterized by the lower end portion of the main body of the cooling tube being located above the ring-shaped main body of the heat shield unit or the heat shield plate.

Using the apparatus for pulling a single crystal in accordance with the eight aspect, by locating the lower end portion of the main body of the cooling tube above the ring-shaped main body of the heat shield unit or the heat shield plate, the temperature gradient in the pulling axis direction of the single crystal is made still larger as a whole, so that the pulling speed can be further increased.

In accordance with a ninth aspect of the present invention, provided is an apparatus for pulling a single crystal according to any of the first to eighth aspects of the present invention characterized by the distance between the ring-shaped main body of the heat shield unit or the heat shield plate and the melt surface ranging within values resulting from the diameter of a single crystal to the pulled being multiplied by 0.2–1.5.

Using the apparatus for pulling a single crystal in accordance with the ninth aspect, since the ring-shaped main body of the heat shield unit or the heat shield plate can be arranged at the position where the crystal temperature is 1000–1300° C., the temperature gradient in the hottest portion of the single crystal can be more easily controlled.

In accordance with a tenth aspect of the present invention, provided is an apparatus for pulling a single crystal according to any of the first to fifth aspects of the present invention characterized by the ring width of the ring-shaped main body of the heat shield unit or the heat shield plate being 10 mm or more.

When the ring width of the ring-shaped main body of the heat shield unit or the heat shield plate is less than 10 mm, the heat shield force is weak, so that the heat shield effect cannot be expected. But using the apparatus for pulling a single crystal in accordance with the tenth aspect, the heat shield effect can be sufficiently secured.

In accordance with an eleventh aspect of the present invention, provided is an apparatus for pulling a single crystal according to any of the first to tenth aspects of the present invention characterized by the thickness of the ring-shaped main body of the heat shield unit or the heat shield plate being within a range of 2 mm–150 mm.

Using the apparatus for pulling a single crystal in accordance with the eleventh aspect, the strength of the ring-shaped main body of the heat shield unit or the heat shield plate can be secured by making the thickness thereof 2 mm or more. Even when the thickness thereof exceeds 150 mm, the heat shield effect is not so different. Accordingly, by making the thickness thereof 150 mm or less, the cost can be inhibited.

BEST MODE FOR CARRYING OUT THE INVENTION

The preferred embodiments of the apparatus for pulling a single crystal according to the present invention are described below by reference to the Figures of the drawings.

Figure 1:
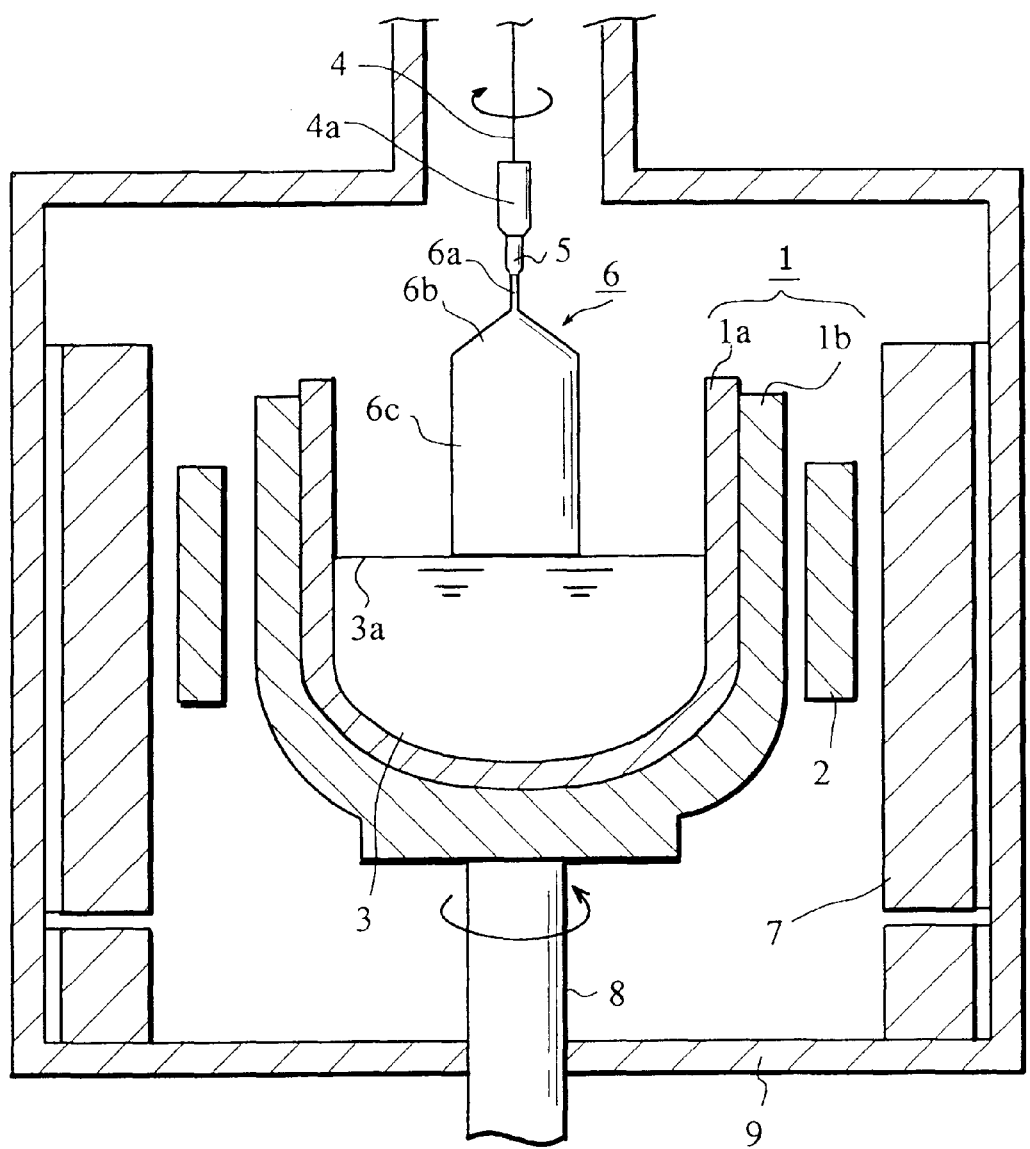
FIG. 1 is a diagrammatic sectional view showing a conventional apparatus for pulling a single crystal used for the CZ method.
Figure 2:
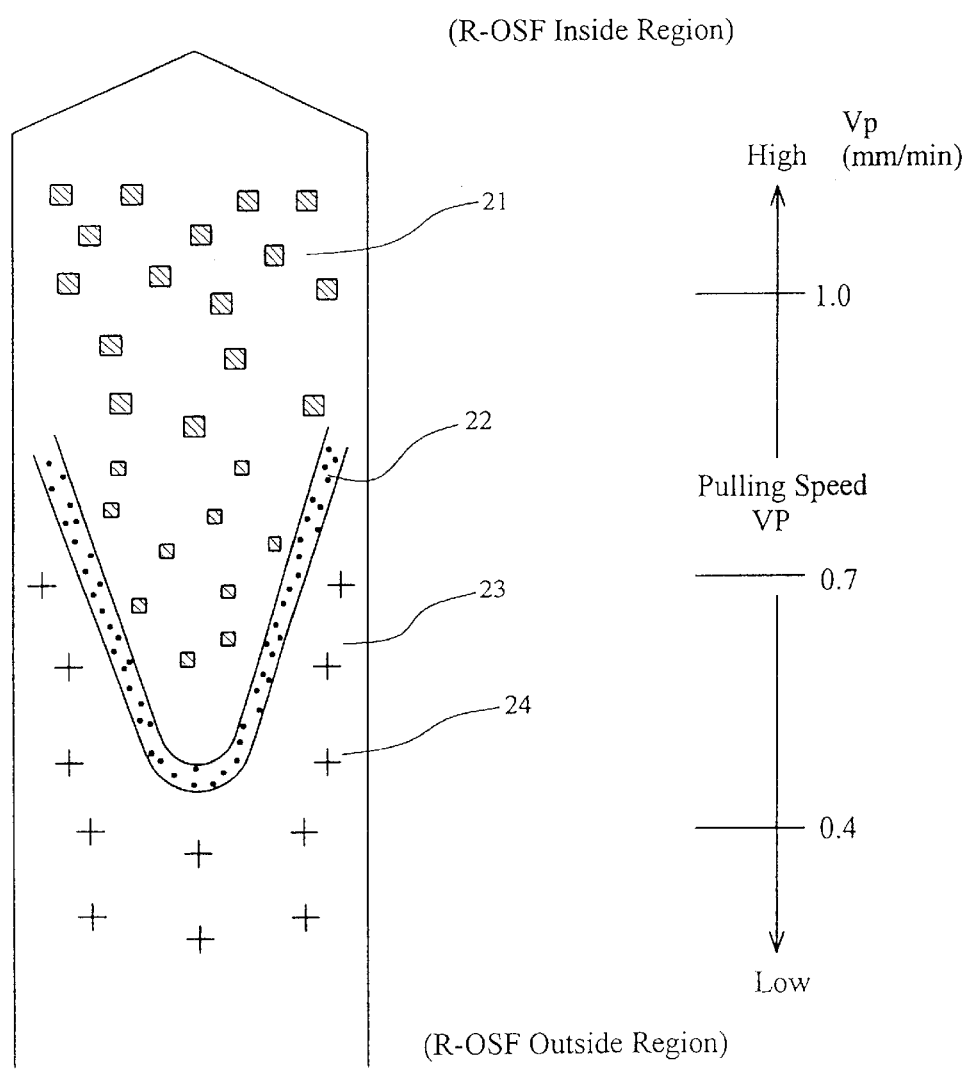
FIG. 2 is a diagram showing the general relation between the pulling speeds during single crystal growth and occurrence positions of crystal defects.
Figure 3:
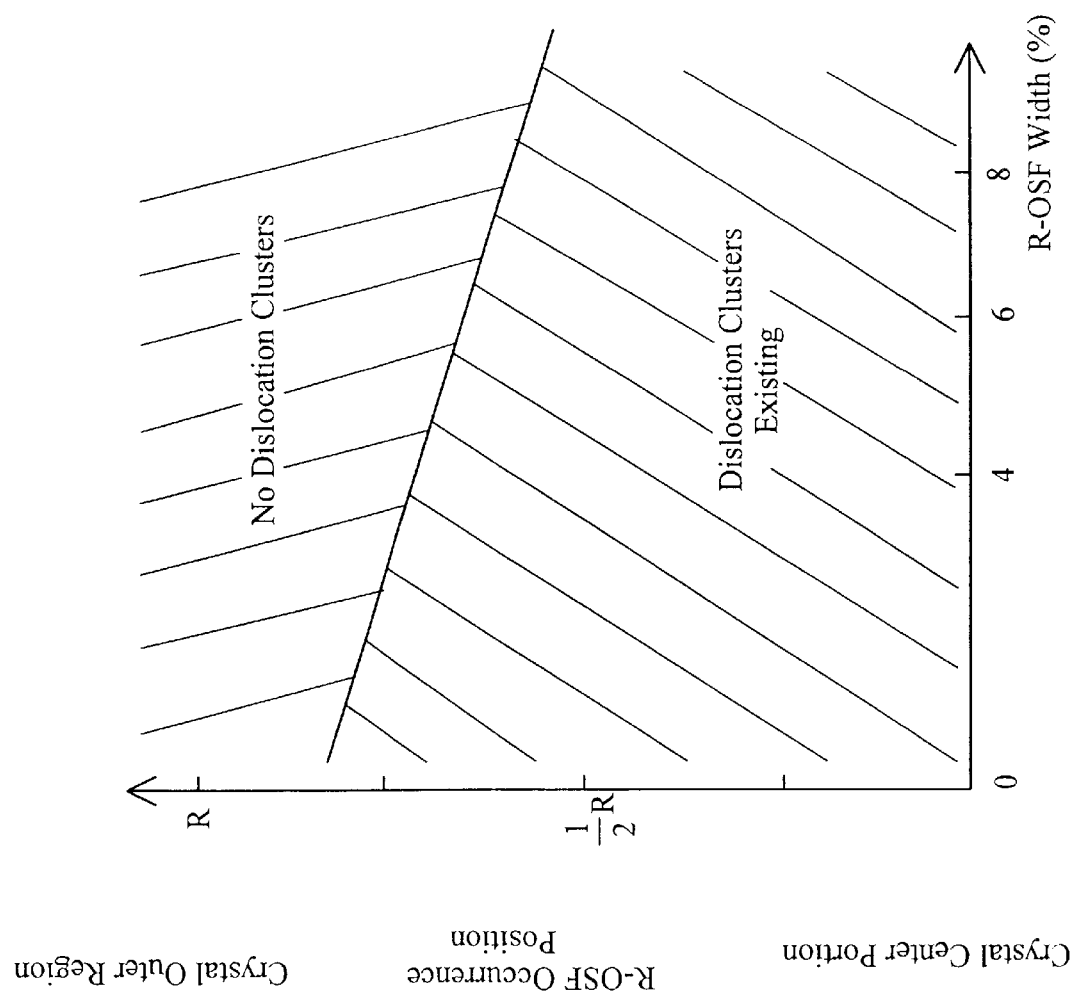
FIG. 3 is a graph indicating the occurrence situation of dislocation clusters on the basis of the relationship between the width of an R-OSF in a single crystal grown with conventional conditions and occurrence position thereof.
Figure 9A:
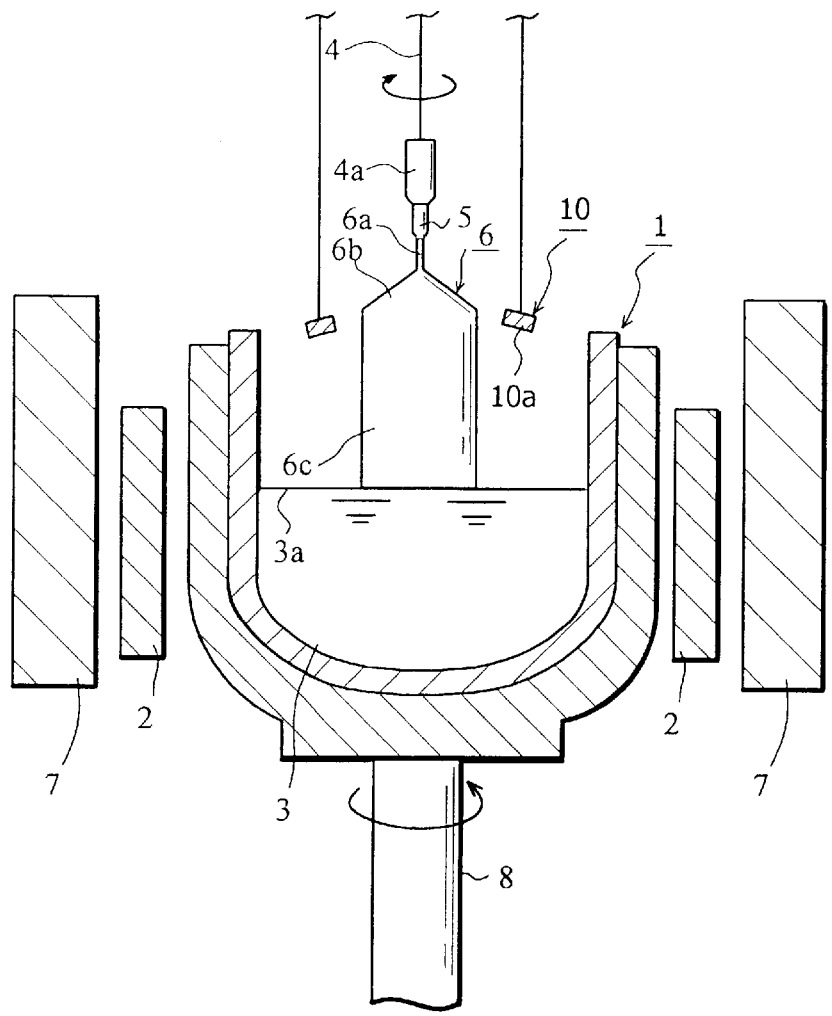
FIGS. 9(a) and 9(b) are diagrammatic sectional views showing an apparatus for pulling a single crystal according to a first embodiment of the present invention.
Figure 9B:
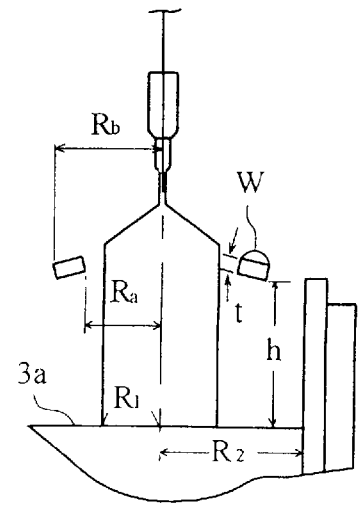

FIGS. 9(a) and 9(b) are diagrammatic sectional views showing an apparatus for pulling a single crystal according to a first embodiment of the present invention. Here, the description of the same construction as that of a conventional apparatus for pulling a single crystal shown in FIG. 1 is omitted.

Reference numeral 10 represents a heat shield unit. The main body 10a of the heat shield unit 10, having a shape of a ring, has the function of inhibiting the radiant heat from diverging upward (to the chamber 9) from the side surface of a pulled single crystal 6 located in the vicinity of the surface of the melt 3, and the function of inhibiting the radiant heat from diverging upward (to the chamber 9) from the surface of the melt 3 and the upper portion of the crucible 1.

The ring width w of the main body 10a is set to 10 mm or more, and the thickness t thereof is preferably within the range of 2 mm–150 mm. The distance h between the main body 10a and the melt surface 3a is preferably within the range of 30 mm–200 mm from the viewpoint of inhibition effect of divergence of radiant heat. In order to make it possible to cause the main body 10a to approach the surface of the melt 3 sufficiently, it is desirable that the distance $R_a$ should be at least equal to the radius $R_1$ of the body portion 6c, and that the distance $R_b$ should be less than the radius $R_2$ of the quartz crucible 1a.

Using the apparatus for pulling a single crystal according to the first embodiment, the temperature gradient in the outer region of the single crystal 6 can be equivalent to or less than that in the center portion thereof by reducing the heat radiation to the chamber 9 from the hottest portion of the single crystal 6. The region of the vacancy concentration range wherein a R-OSF is generated is enlarged, so that the width of the R-OSF can be made larger. Therefore, by making the occurrence position of the R-OSF shrink and making the width thereof increase, a single crystal 6 having a low defect density can be grown.

Figure 10A:
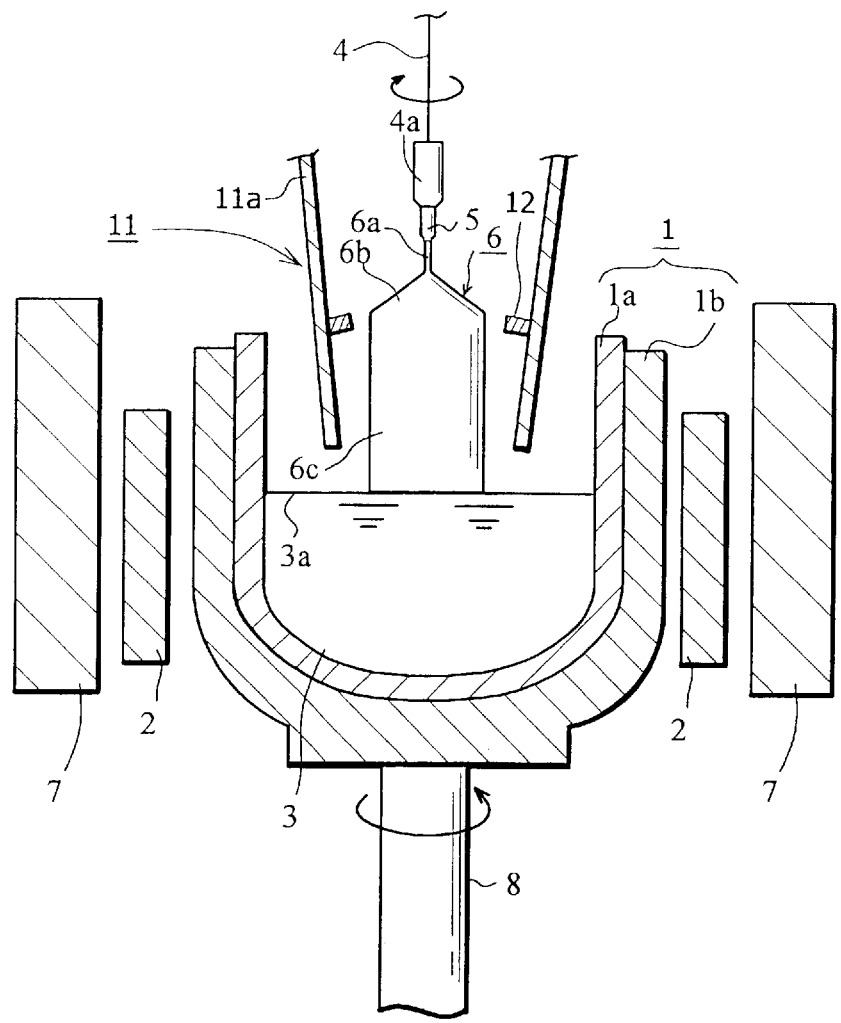
FIGS. 10(a) and 10(b) are diagrammatic sectional views showing an apparatus for pulling a single crystal according to a second embodiment.
Figure 10B:
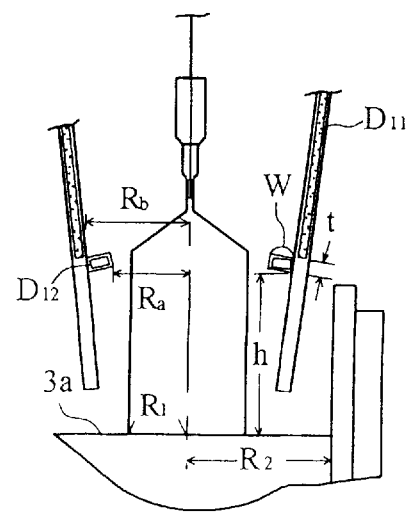

FIGS. 10(a) and 10(b) are diagrammatic sectional views showing an apparatus for pulling a single crystal according to a second embodiment. Here, the description of the same construction as that of the conventional apparatus for pulling a single crystal shown in FIG. 1 is omitted.

Reference numeral 11 represents a straightening vane. The main body 11a of the straightening vane 11, having a shape of a side surface of an inverted truncated cone, is located so as to surround a pulled single crystal 6 and is arranged so that the lower end portion thereof is located above the melt surface 3a within the crucible 1. Ordinarily, the distance between the lower end portion of the straightening vane 11 and the melt surface 3a is preferably set to 15 mm–30 mm or so. A ring-shaped heat shield plate 12 is fitted (e.g. by insetting) to the inside of the straightening vane 11. The heat shield plate 12 inhibits the radiant heat from diverging upward (to the chamber 9) from the side surface of the pulled single crystal 6 located in the vicinity of the surface of the melt 3, and inhibits the radiant heat from diverging upward (to the chamber 9) from the surface of the melt 3 and the upper portion of the crucible 1. As is shown in FIG. 10(b), heat insulators are embedded in the heat shield plate 12 and the upper portion of the straightening vane 11 above the point where the heat shield plate 12 is fitted. Here, in order to secure a field of view of a camera, a notch is sometimes formed in part of the ring.

The ring width w of the heat shield plate 12 is set to 10 mm or more from the viewpoint of heat shield effect, and the thickness t thereof is preferably within the range of 2 mm–150 mm from the viewpoint of the heat shield effect and strength. The distance h between the heat shield plate 12 and the melt surface 3a is preferably within the range of 30 mm–200 mm from the viewpoint of the heat shield effect. It is preferable that the distance $R_a$ should be greater than the radius $R_1$ of the body portion 6c, and that the distance $R_b$ should be less than the radius $R_2$ of the quartz crucible 1a.

Using the apparatus for pulling a single crystal according to the second embodiment, the temperature gradient in the outer region of the single crystal 6 can be equivalent to or less than that in the center portion thereof by reducing the heat radiation to the chamber 9 from the hottest portion of the single crystal 6. The region of the vacancy concentration range wherein an R-OSF is generated is enlarged, so that the width of the R-OSF can be made larger. Therefore, by making the occurrence position of the R-OSF shrink and making the width thereof increase, a single crystal 6 having a low defect density can be grown. The ring-shaped heat shield plate 12 can be fitted to the straightening vane 11 by simply mounting the heat shield plate 12 on the straightening vane 11. The heat shield plate 12 can be easily arranged.

By the heat insulator being embedded in the straightening vane 11, the whole temperature gradient in the pulling axis direction in the single crystal 6 can be made larger. When the temperature gradient in the pulling axis direction in the single crystal 6 becomes larger as a whole, the diffusion rate of vacancy taken inside the single crystal 6 toward the solid-liquid interface becomes higher, so that it becomes difficult to secure the region, wherein the vacancy concentration in which an R-OSF occurs and the single crystal 6 plane are coincident with each other, at usual pulling speeds. In order to hold the diffusion rate down, the pulling speed can be made higher. Accordingly, the production efficiency of the single crystal 6 can be improved. The heat insulator is not embedded in the lower portion of the straightening vane 11 in order to keep the heat input from the heater 2 to the single crystal 6 large.

Figure 11:
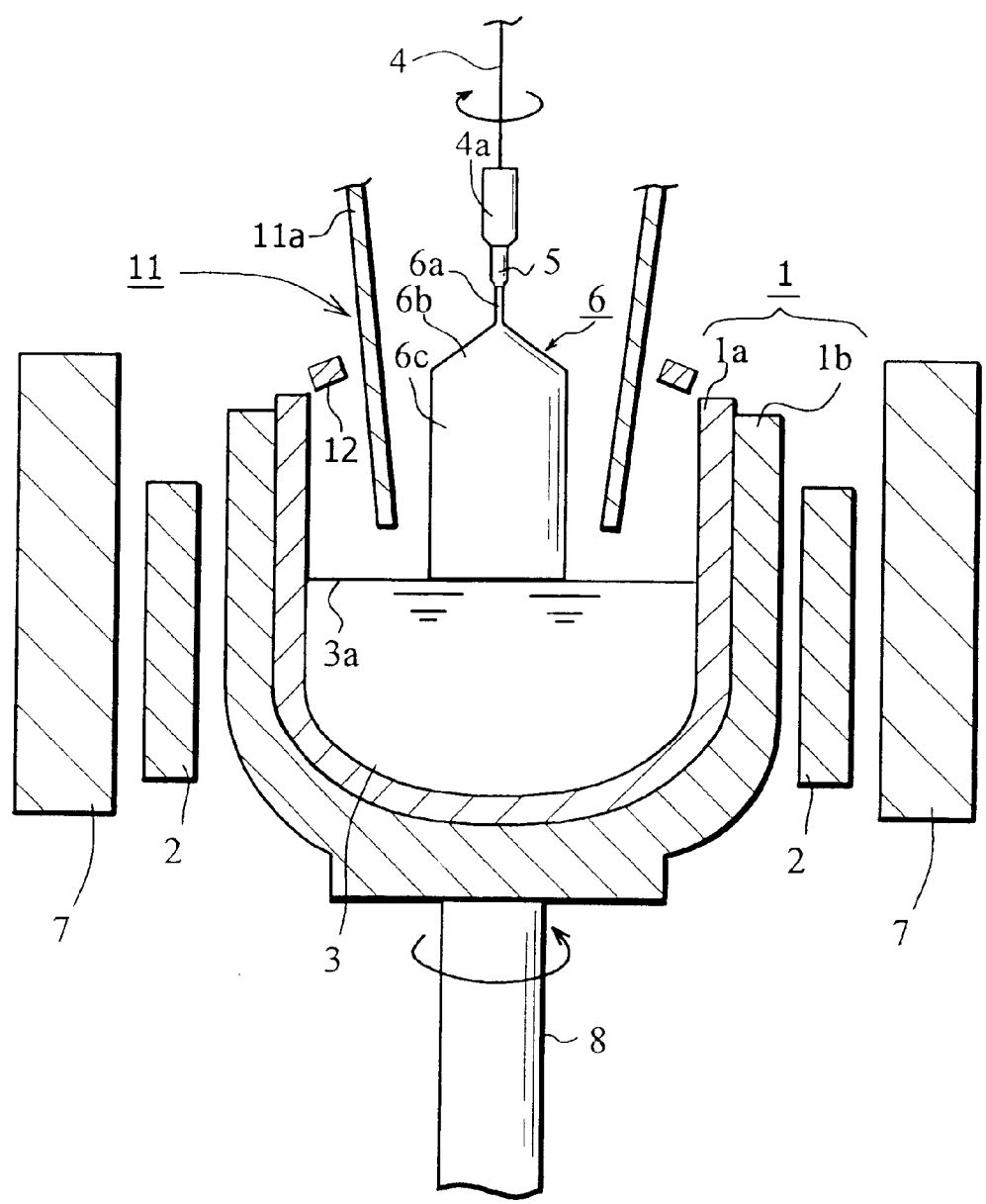
FIG. 11 is a diagrammatic sectional view showing an apparatus for pulling a single crystal according to a third embodiment.

FIG. 11 is a diagrammatic sectional view showing an apparatus for pulling a single crystal according to a third embodiment. Here, the description of the same construction as that of the apparatus for pulling a single crystal shown in FIGS. 10(a) and 10(b) is omitted.

In the apparatus for pulling a single crystal according to the third embodiment, different from the apparatus for pulling a single crystal according to the second embodiment shown in FIGS. 10(a) and 10(b), a heat shield plate 12 is arranged outside a straightening vane 11. The heat shield plate 12 may be formed as one body with the straightening vane 11, or may be arranged separately outside the straightening vane 11. The other construction is the same as that of the apparatus for pulling a single crystal according to the second embodiment shown in FIGS. 10(a) and 10(b).

Using the apparatus for pulling a single crystal according to the third embodiment, the same effect as that obtained by the apparatus for pulling a single crystal according to the second embodiment can be obtained.

Figure 12:
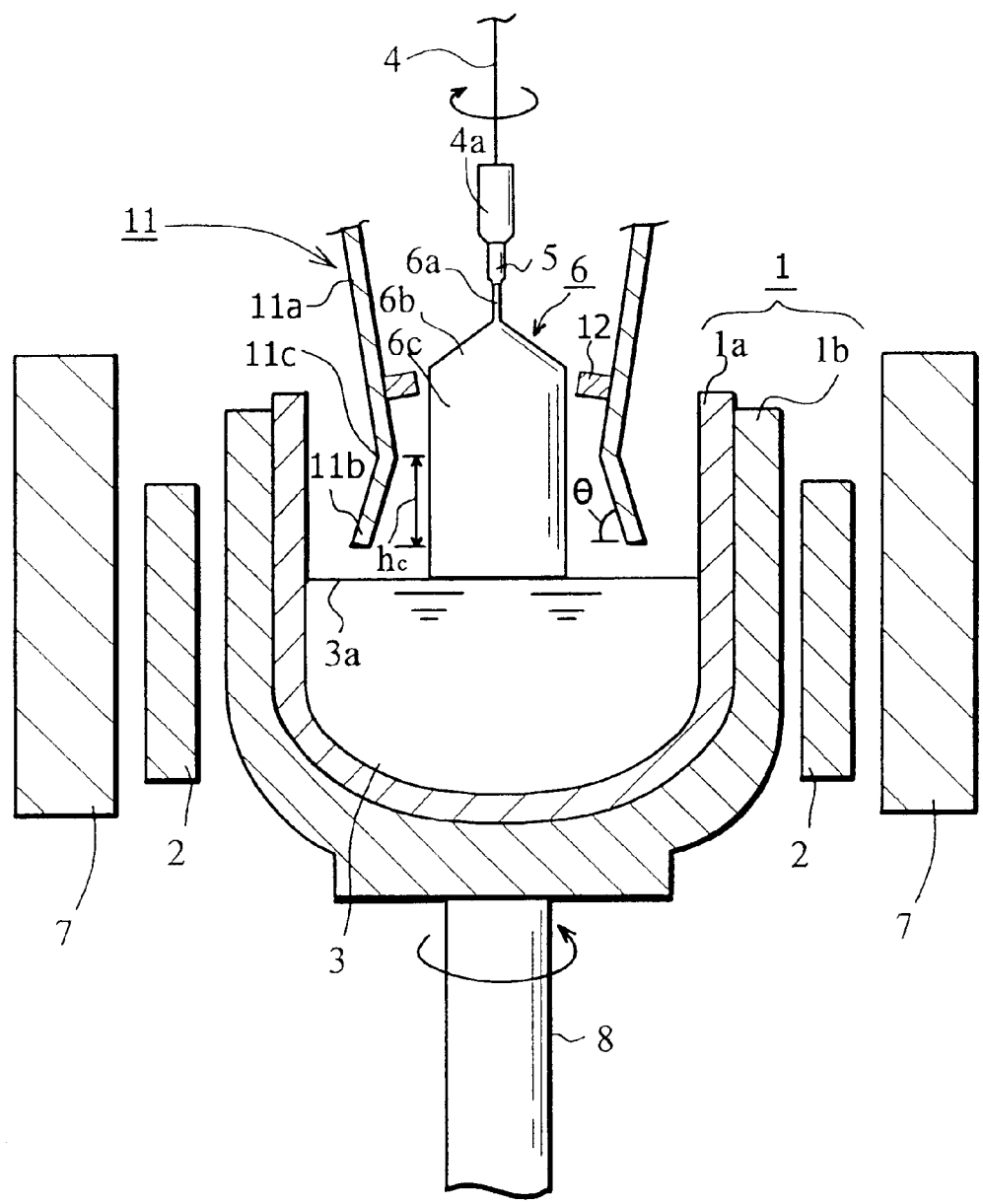
FIG. 12 is a diagrammatic sectional view showing an apparatus for pulling a single crystal according to a fourth embodiment.

FIG. 12 is a diagrammatic sectional view showing an apparatus for pulling a single crystal according to a fourth embodiment. Here, the description of the same construction as that of the apparatus for pulling a single crystal shown in FIGS. 10(a) and 10(b) is omitted.

In the apparatus for pulling a single crystal according to the fourth embodiment, the lower portion 11b of the main body 11a of a straightening vane 11 widens toward the lower end and the main body 11a and narrows inward toward the lower end in total, so that the main body 11a has a flection 11c. The flection 11c is located below the fitting position of a heat shield plate 12. The distance $h_c$, between the lower end of the straightening vane 11 and the flection 11c is preferably 10 mm or more, and the angle θ is preferably 15° or more and less than 90°.

Using the apparatus for pulling a single crystal according to the fourth embodiment, the same effect as that obtained by the apparatus for pulling a single crystal according to the second embodiment can be shown. Moreover, since the inside of the lower portion 11b of the straightening vane 11 is efficiently heated from the melt surface 3a which is a rather hot portion in the crucible, the heat input to the outer region of the single crystal 6 facing the inside of the lower portion 11b of the straightening vane 11 can be increased. As a result, more certainly, the temperature gradient in the outer region of the single crystal 6 can be equivalent to or less than that in the center portion of the single crystal 6.

Figure 13:
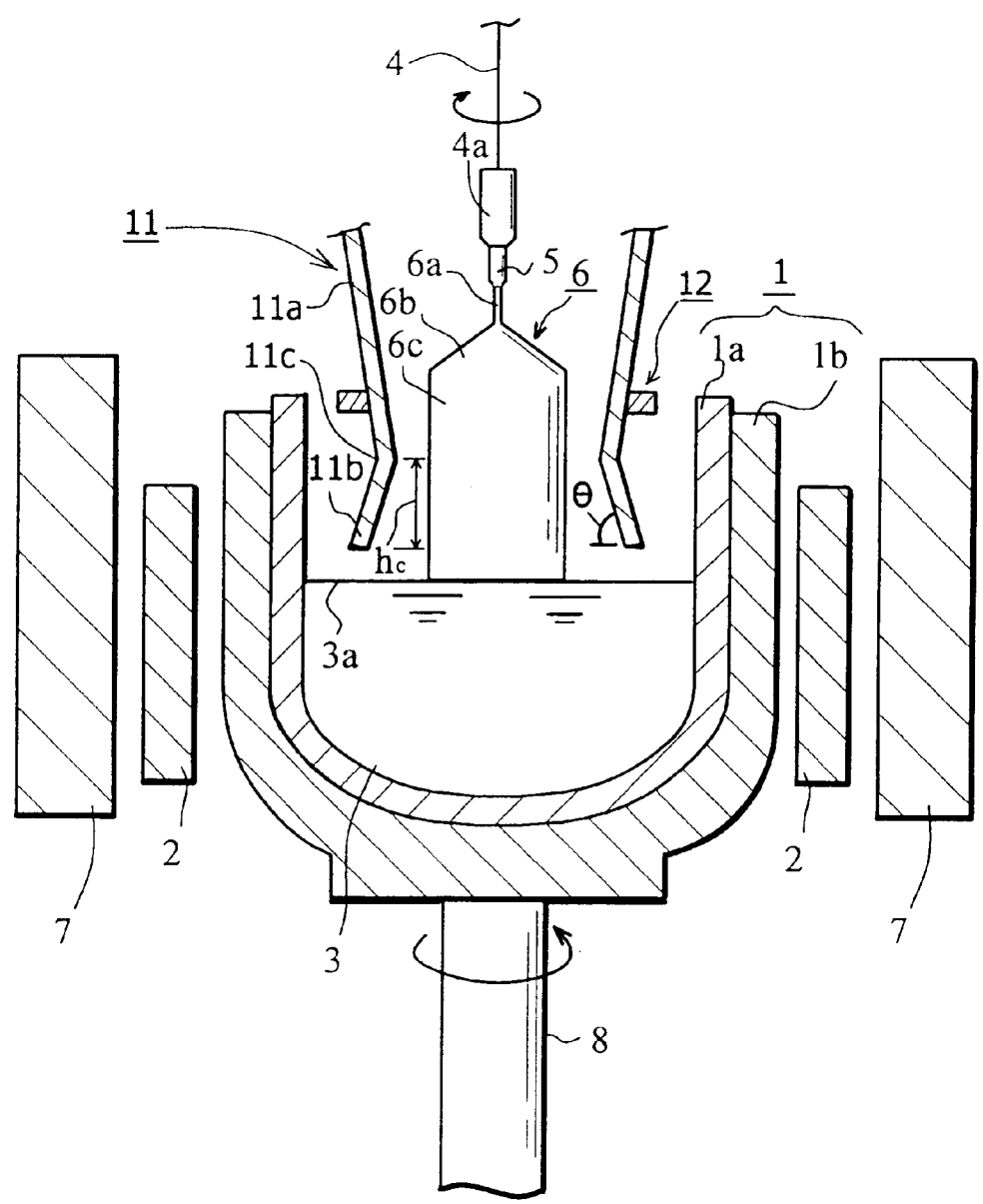
FIG. 13 is a diagrammatic sectional view showing an apparatus for pulling a single crystal according to a fifth embodiment.

FIG. 13 is a diagrammatic sectional view showing an apparatus for pulling a single crystal according to a fifth embodiment. Here, the description of the same construction as that of the apparatus for pulling a single crystal shown in FIG. 12 is omitted.

In the apparatus for pulling a single crystal according to the fifth embodiment, different from the apparatus for pulling a single crystal according to the fourth embodiment shown in FIG. 12, a heat shield plate 12 is arranged outside a straightening vane 11. The heat shield plate 12 may be formed as one body with the straightening vane 11, or may be arranged separately outside the straightening vane 11. The other construction is the same as that of the apparatus for pulling a single crystal according to the fourth embodiment shown in FIG. 12.

Using the apparatus for pulling a single crystal according to the fifth embodiment, the same effect as that obtained by the apparatus for pulling a single crystal according to the fourth embodiment can be obtained.

Figure 14:
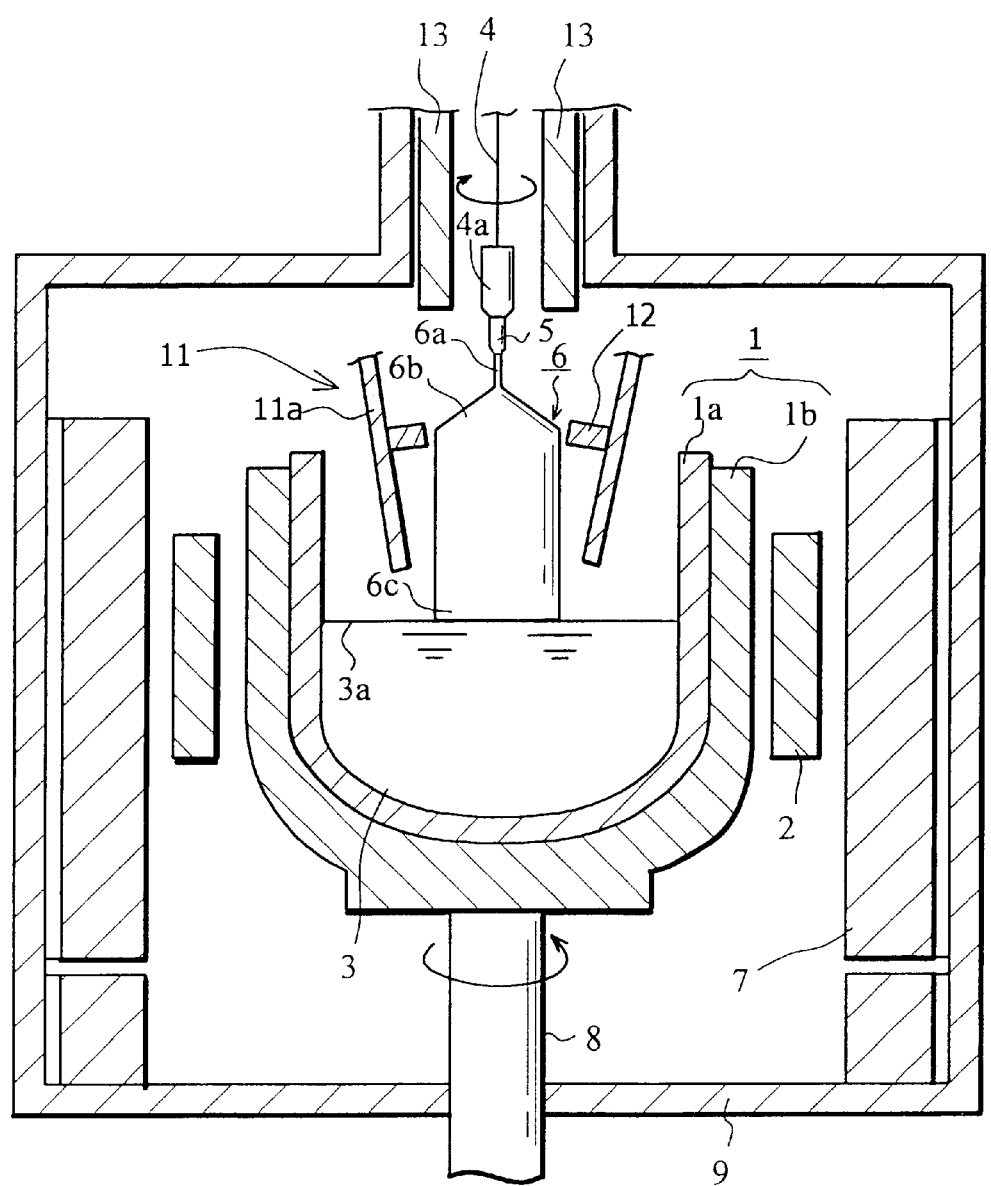
FIG. 14 is a diagrammatic sectional view showing an apparatus for pulling a single crystal according to a sixth embodiment.

FIG. 14 is a diagrammatic sectional view showing an apparatus for pulling a single crystal according to a sixth embodiment. Here, the description of the same construction as that of the apparatus for pulling a single crystal shown in FIGS. 10(a) and 10(b) is omitted.

Reference numeral 13 represents the main body of a water cooled type cooling tube called a draw tube. The main body of the cooling tube 13 surrounds a pulled single crystal 6 and is arranged so that it is located above a heat shield plate 12.

Using the apparatus for pulling a single crystal according to the sixth embodiment, the same effect as that obtained by the apparatus for pulling a single crystal according to the second embodiment can be realized. Moreover, by arranging the main body of the cooling tube 13 in a prescribed position, the whole temperature gradient in the pulling axis direction of the single crystal 6 can be made larger. When the temperature gradient in the single crystal 6 becomes larger as a whole, the diffusion rate of vacancy taken inside the single crystal 6 toward the solid-liquid interface becomes higher. In order to secure the region wherein the vacancy concentration in which an R-OSF occurs and the single crystal 6 are coincident with each other so as to hold the diffusion rate down, the pulling speed can be made higher. Accordingly, the production efficiency of the single crystal 6 can be further improved.

By locating the lower end portion of the main body of the cooling tube 13 above the heat shield plate 12, the whole temperature gradient in the pulling axis direction of the single crystal 6 can be made still larger, and the pulling speed can be made still higher.

Here, only the case in which the main body of the cooling tube 13 is arranged in the apparatus for pulling a single crystal shown in FIGS. 10(a) and 10(b) is described, but it is a matter of course that the main body of the cooling tube 13 can be arranged in the apparatus for pulling a single crystal shown in FIGS. 9(a) and 9(b), and 12.

Figure 15:
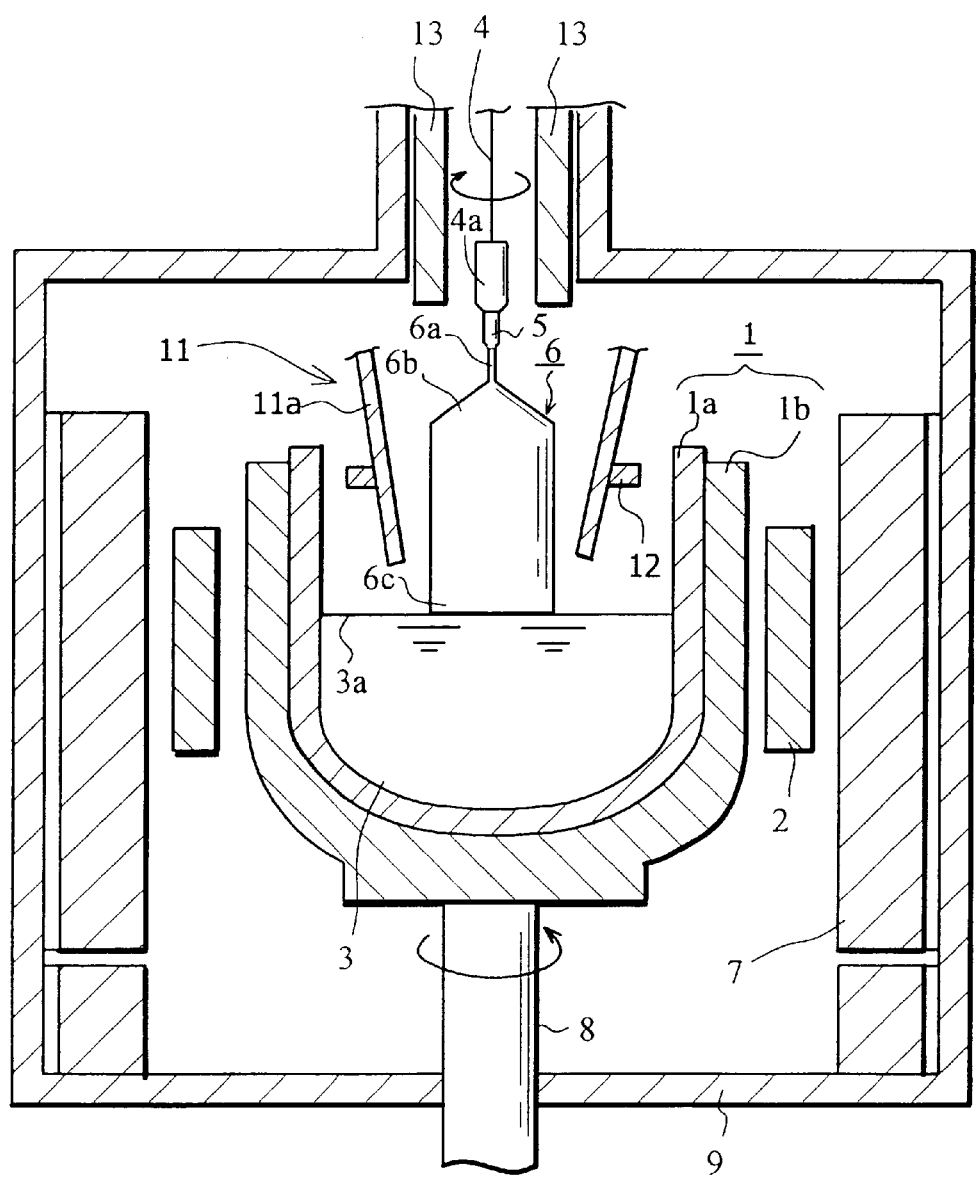
FIG. 15 is a diagrammatic sectional view showing an apparatus for pulling a single crystal according to a seventh embodiment.

FIG. 15 is a diagrammatic sectional view showing an apparatus for pulling a single crystal according to a seventh embodiment. Here, the description of the same construction as that of the apparatus for pulling a single crystal shown in FIG. 14 is omitted.

In the apparatus for pulling a single crystal according to the seventh embodiment, different from the apparatus for pulling a single crystal according to the sixth embodiment shown in FIG. 14, a heat shield plate 12 is arranged outside a straightening vane 11. The heat shield plate 12 may be formed as one body with the straightening vane 11, or may be arranged separately outside the straightening vane 11. The other construction is the same as that of the apparatus for pulling a single crystal according to the sixth embodiment shown in FIG. 14.

Using the apparatus for pulling a single crystal according to the seventh embodiment, the same effect as that obtained by the apparatus for pulling a single crystal according to the sixth embodiment can be obtained.

EXAMPLES AND COMPARATIVE EXAMPLES

The apparatus for pulling a single crystal according to Examples are described below.

Example 1

Using the apparatus shown in FIGS. 9(a) and 9(b), the crucible 1 was charged with polysilicon of 60 kg as a material for forming a crystal, to which boron to be a P-type dopant was added so that the electrical resistivity in the crystal became about 10 Ωcm. After making an Ar atmosphere of about 1300 Pa in the chamber 9, all of the material for forming a crystal was melted by controlling power of the heater 2.

While the power of the heater 2 was controlled, the position of the heater 2 was controlled. Then, the lower end portion of the seed crystal 5 was dipped into the melt 3, and a single crystal 6 having a diameter of 6 inches was pulled while the crucible 1 and the pulling axis 4 were rotated. At that time, the pulling speed of the single crystal 6 was gradually reduced when the length of the body portion 6c reached 100 mm.

Here, the ring width w of the main body 10a of the heat shield unit 10 was 70 mm (including the width of the heat insulator D of 60 mm), and the thickness t thereof was 20 mm (including the thickness of the heat insulator D of 10 mm). The distance h between the main body 10a and the melt surface 3a was set to 120 mm.

Figure 16:
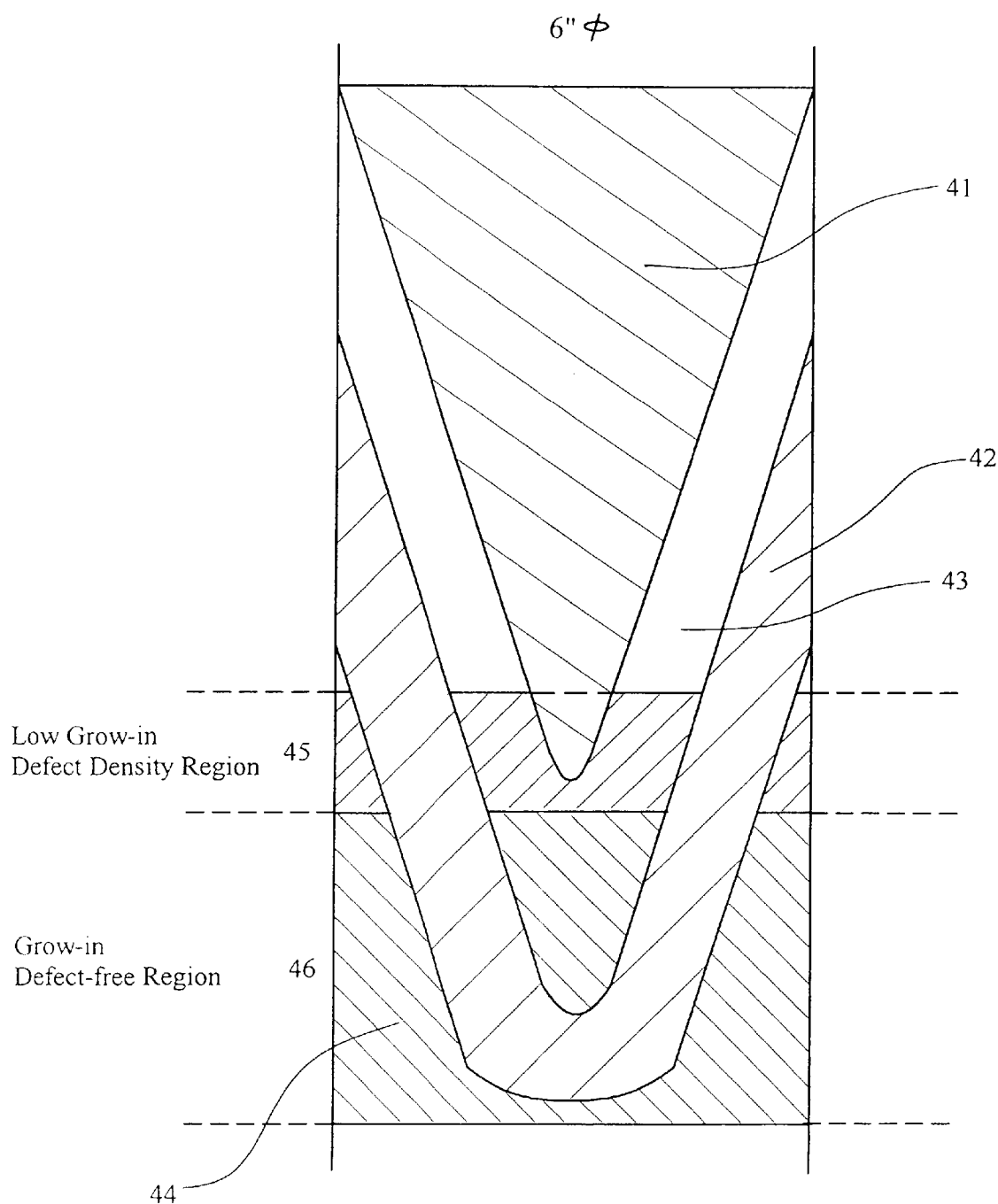
FIG. 16 is a diagram showing the occurrence region of grown-in defects in a single crystal obtained in Example 1.

FIG. 16 is a diagram showing the result from an X-ray topograph taken after a single crystal obtained in the Example 1, which was slivered, was applied with Cu, and was heat treated at 900° C. so as to distinguish each grown-in defect region. Reference numerals 41 and 43 in the figure represent a region where FP defects are generated and a region where no FP defects are generated, respectively.

The width of the R-OSF 42 was about 30 mm (about 40% of the radius of the single crystal 6). It was ascertained that the width of the R-OSF became much larger, compared with the width of the R-OSF in a conventional single crystal (8% maximum). At the largest part of the R-OSF 42, the width of one side thereof became larger to 40 mm maximum, and the total width of both sides thereof attained 80 mm. More than half of the radius of the 6-inch single crystal was within the R-OSF 42 region. Even if the occurrence position of the R-OSF 42 moved inward, no dislocation clusters were generated outside the R-OSF 42 (44 in the figure) since the width of the R-OSF 42 was large. Even when the R-OSF 42 disappeared on the inside of the single crystal 6, no dislocation clusters were generated. Regions 45 and 46 represent a region having a low density of grown-in defects and a region wherein no grown-in defects were detected, respectively.

Figure 17:
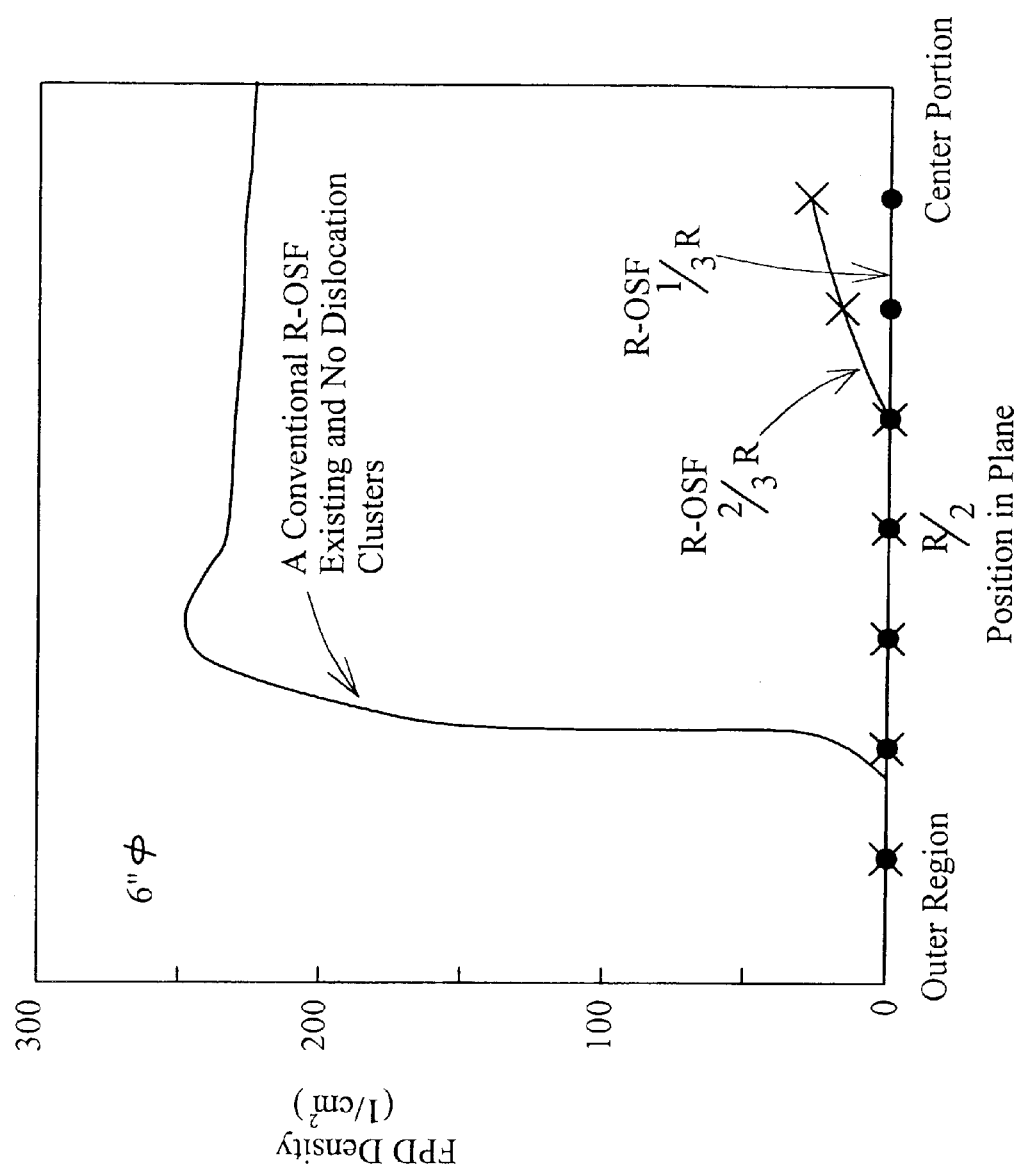
FIG. 17 is a graph indicating the relationship between the R-OSF position within a plane of a crystal in the as-grown state obtained in the Example 1 and distribution density of FP defects.

FIG. 17 is a graph indicating the relationship between the position of an R-OSF 42 within a plane of a crystal in the as-grown state obtained in the Example 1 and distribution density of FP defects. Here, the position of the R-OSF 42 within the plane was observed after Secco etching treatment. The width of the R-OSF 42 was 30 mm, which was about 39% of the crystal radius. As is obvious from FIG. 17, where the position r of the R-OSF 42 within the plane was (2/3) R, FP defects were observed in the center portion of the crystal. But where r=(1/3)R, no FP defects were observed. Therefore, it was ascertained that a crystal in which grown-in defects such as infrared scatterers (FPD) and dislocation clusters are not observed within the plane thereof can be grown by regulating the growth conditions so as to control the width and occurrence position of the R-OSF.

Figure 18:
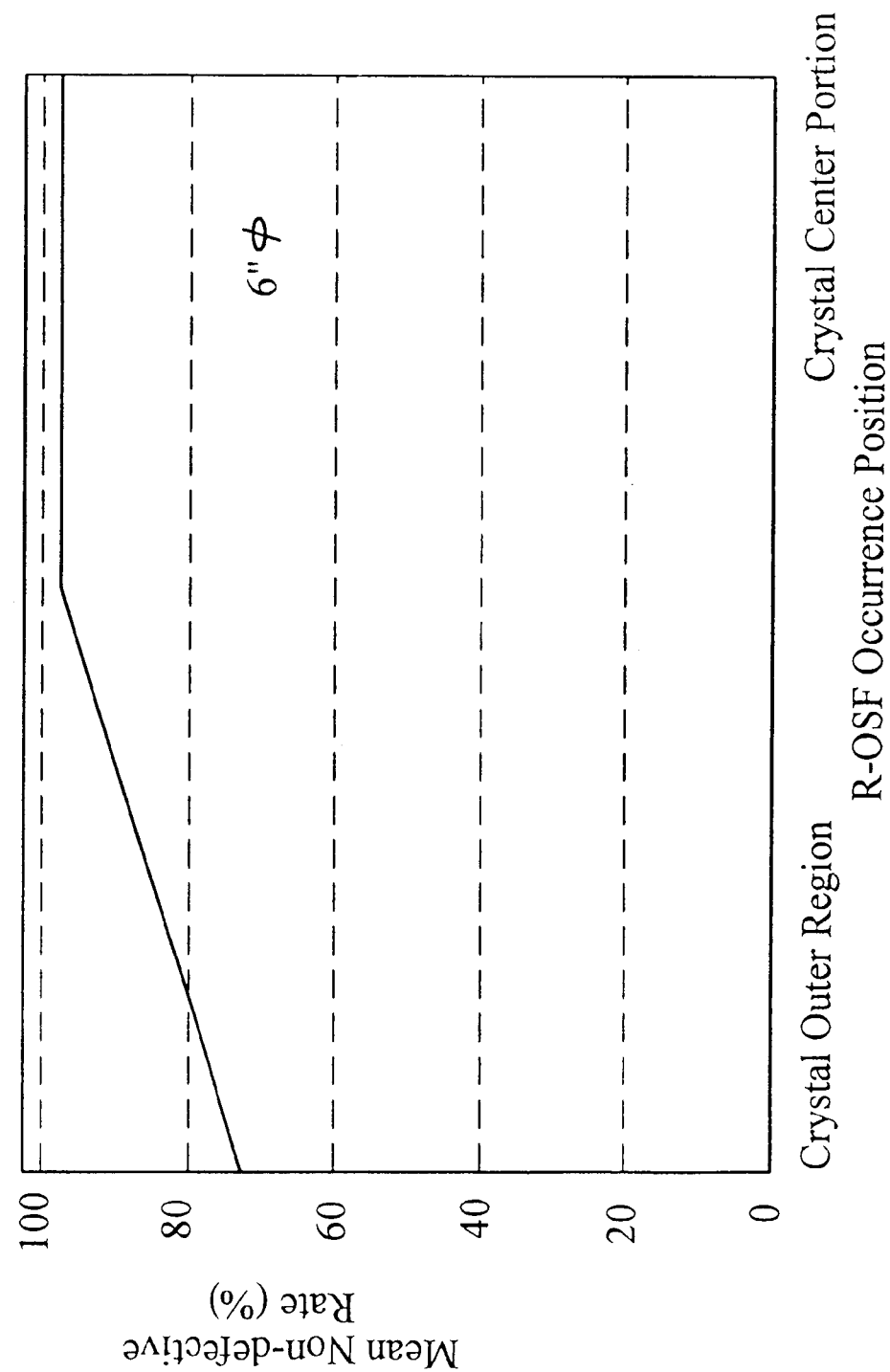
FIG. 18 is a graph indicating the result of the examination of TZDB of single crystal wafers manufactured from a single crystal obtained in the Example 1.

FIG. 18 is a graph indicating the result of the examination of time zero dielectric breakdown (TZDB) of single crystal wafers manufactured from a single crystal obtained in the Example 1, which shows the mean non-defective rates to the occurrence positions of the R-OSF. Here, the mean non-defective rates in the case where the oxide film thickness was 25 nm and the electric field of 8 MV/cm was applied were found. As is obvious from FIG. 18, the non-defective rate of the TZDB in the case where the R-OSF occurrence position r was (1/3)R and the FPD density within the plane was extremely small (see FIG. 17) was 95% or more.

Example 2

On the conditions which were the same as those of the Example 1 except for the quantity of polysilicon (120 kg) filled in the crucible 1 as a material for forming a crystal, a single crystal 6 having a diameter of 8 inches was pulled. The pulling speed of the single crystal 6 was also gradually decreased in the similar manner.

Figure 19:
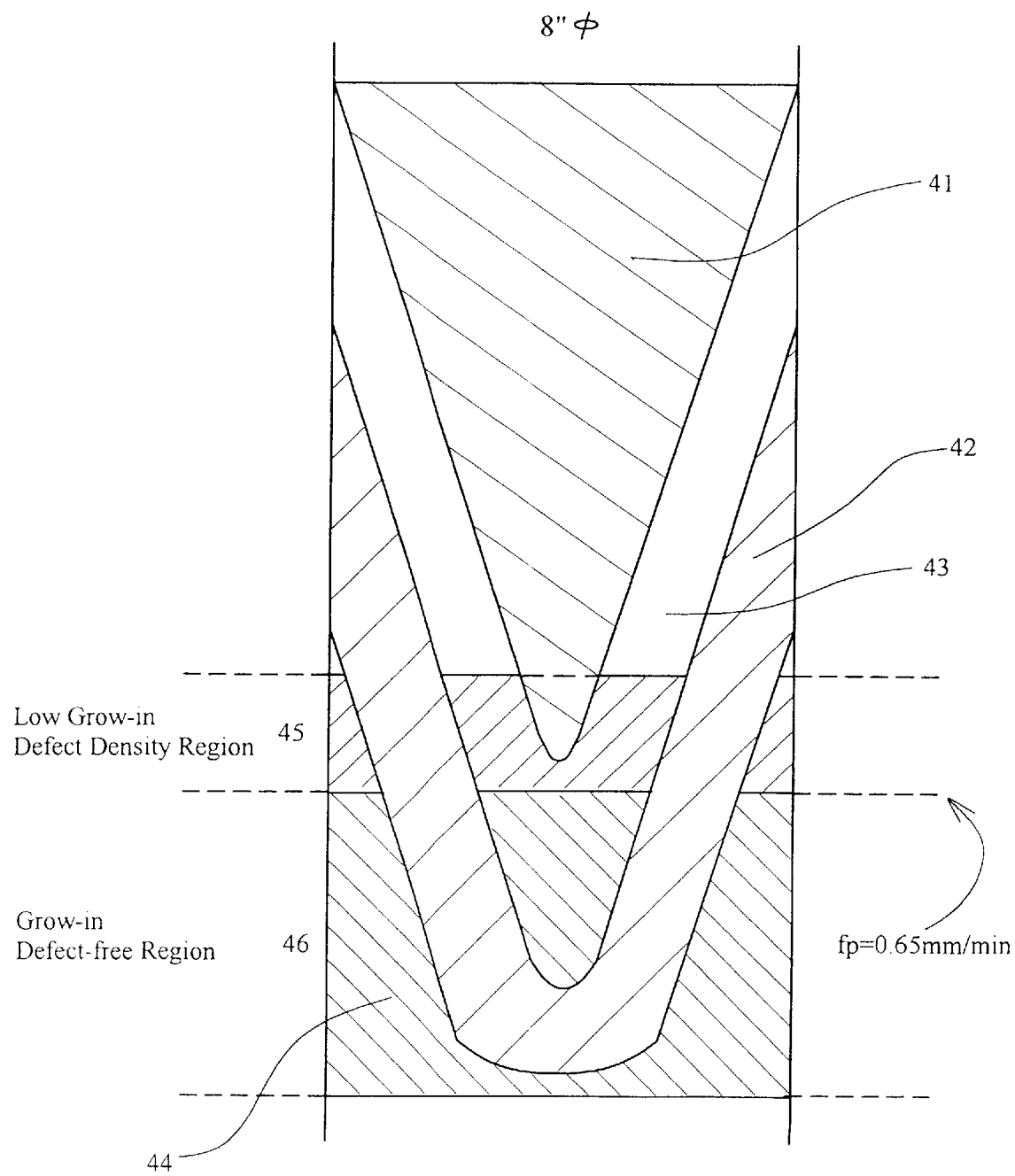
FIG. 19 is a diagram showing the occurrence region of grown-in defects in a single crystal obtained in Example 2.

FIG. 19 is a diagram showing the result from an X-ray topograph taken after a single crystal obtained in the Example 2, which was slivered, was applied with Cu, and was heat treated at 900° C. so as to distinguish each grown-in defect region.

The width of the R-OSF 42 was about 40 mm (about 40% of the radius of the single crystal 6). It was ascertained that the width of the R-OSF became much larger, compared with the width of the R-OSF in a conventional single crystal (8% maximum). At the largest part of the R-OSF 42, the width of one side thereof became larger to 40 mm maximum, and the total width of both sides thereof attained 80 mm. Even if the occurrence position of the R-OSF 42 moved inward, no dislocation clusters were generated outside the R-OSF 42 (44 in the figure) since the width of the R-OSF 42 was large. Even when the R-OSF 42 disappeared on the inside of the single crystal 6, no dislocation clusters were generated. The grown-in defects were not generated when the pulling speed fp was 0.65 mm/min or less.

Figure 20:
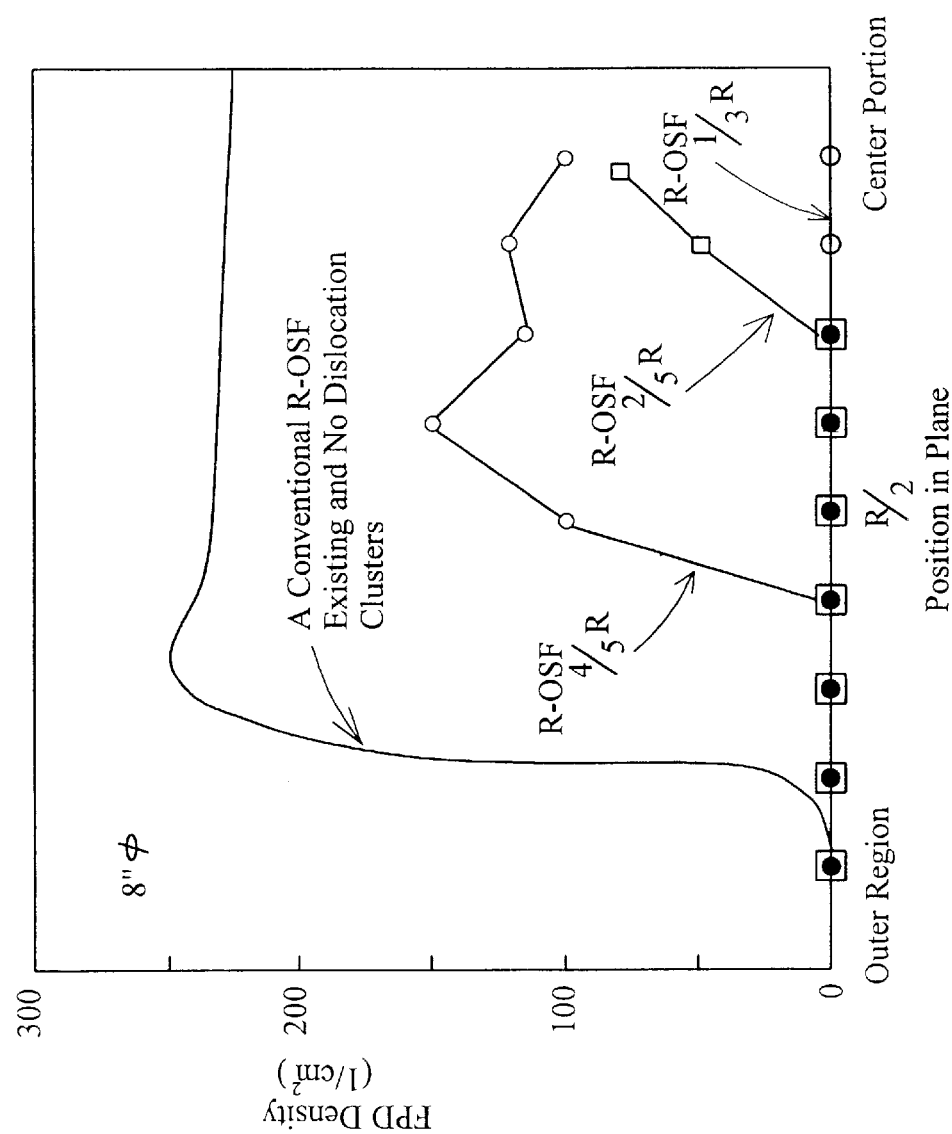
FIG. 20 is a graph indicating the relationship between the R-OSF position within a plane of a crystal in the as-grown state obtained in the Example 2 and distribution density of FP defects.

FIG. 20 is a graph indicating the relationship between the position of an R-OSF within a plane of a crystal in the as-grown state obtained in the Example 2 and distribution density of FP defects. As is obvious from FIG. 20, where the R-OSF position r within the plane was (2/5)R, FP defects were observed in the center portion of the crystal. But where r=(1/3)R, no FP defects were observed.

Figure 21:
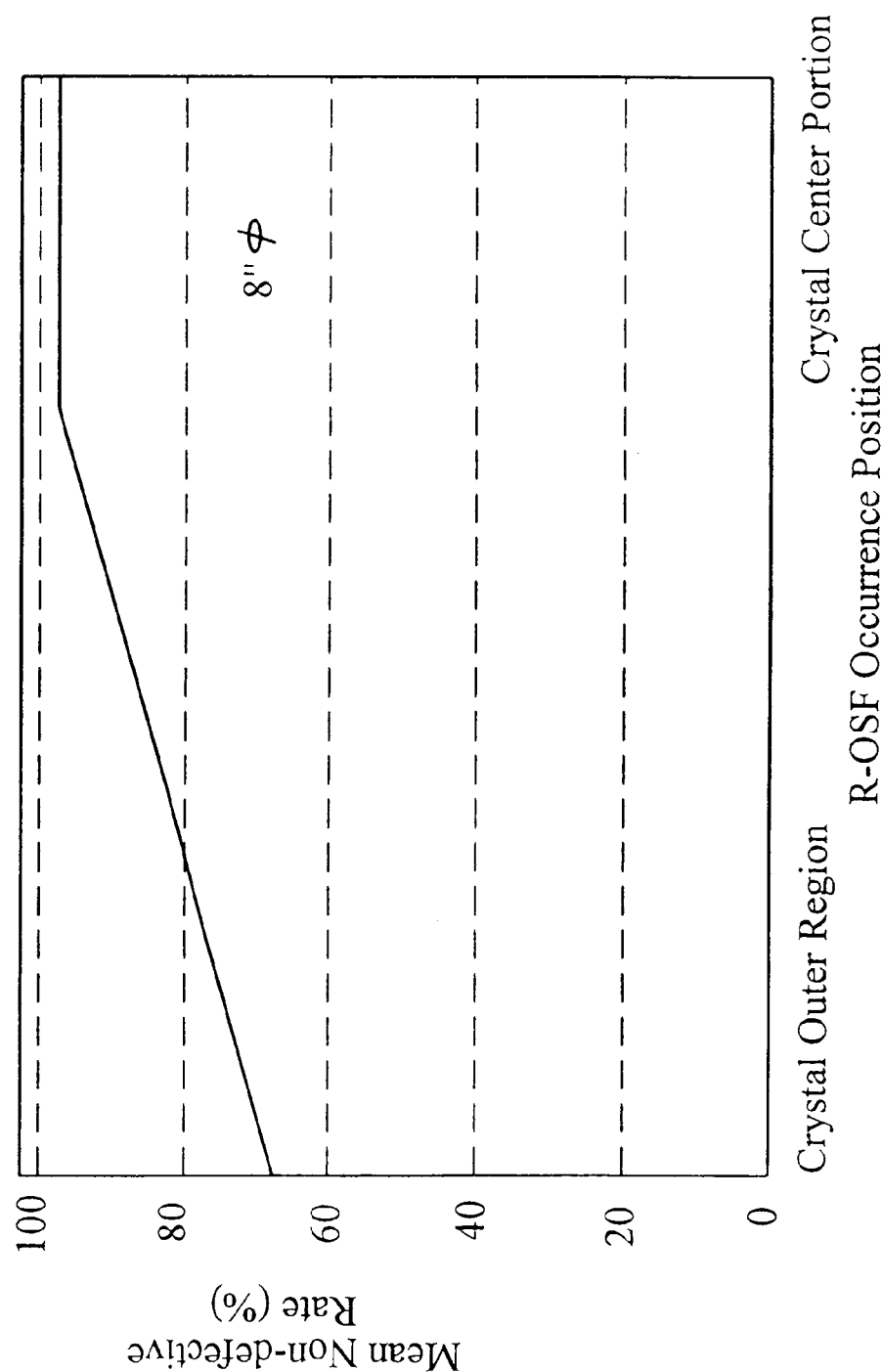
FIG. 21 is a graph indicating the result of the examination of TZDB of single crystal wafers manufactured from a single crystal obtained in the Example 2.

FIG. 21 is a graph indicating the result of the examination of TZDB of single crystal wafers manufactured from a single crystal obtained in the Example 2, which shows the mean non-defective rates to the R-OSF occurrence positions r. As is obvious from FIG. 21, the non-defective rate of the TZDB in the case where the R-OSF occurrence position r was (1/3)R and the FPD density within the plane was extremely small was 95% or more.

Example 3

A single crystal 6 having a diameter of 6 inches was pulled in the similar manner to that in the Example 1. Here, the pulling speed was controlled so that the R-OSF occurrence position r was (1/3)R, the body portion 6c was grown to 1000 mm, and the situation of the R-OSF or each defect region was examined.

Figure 4:
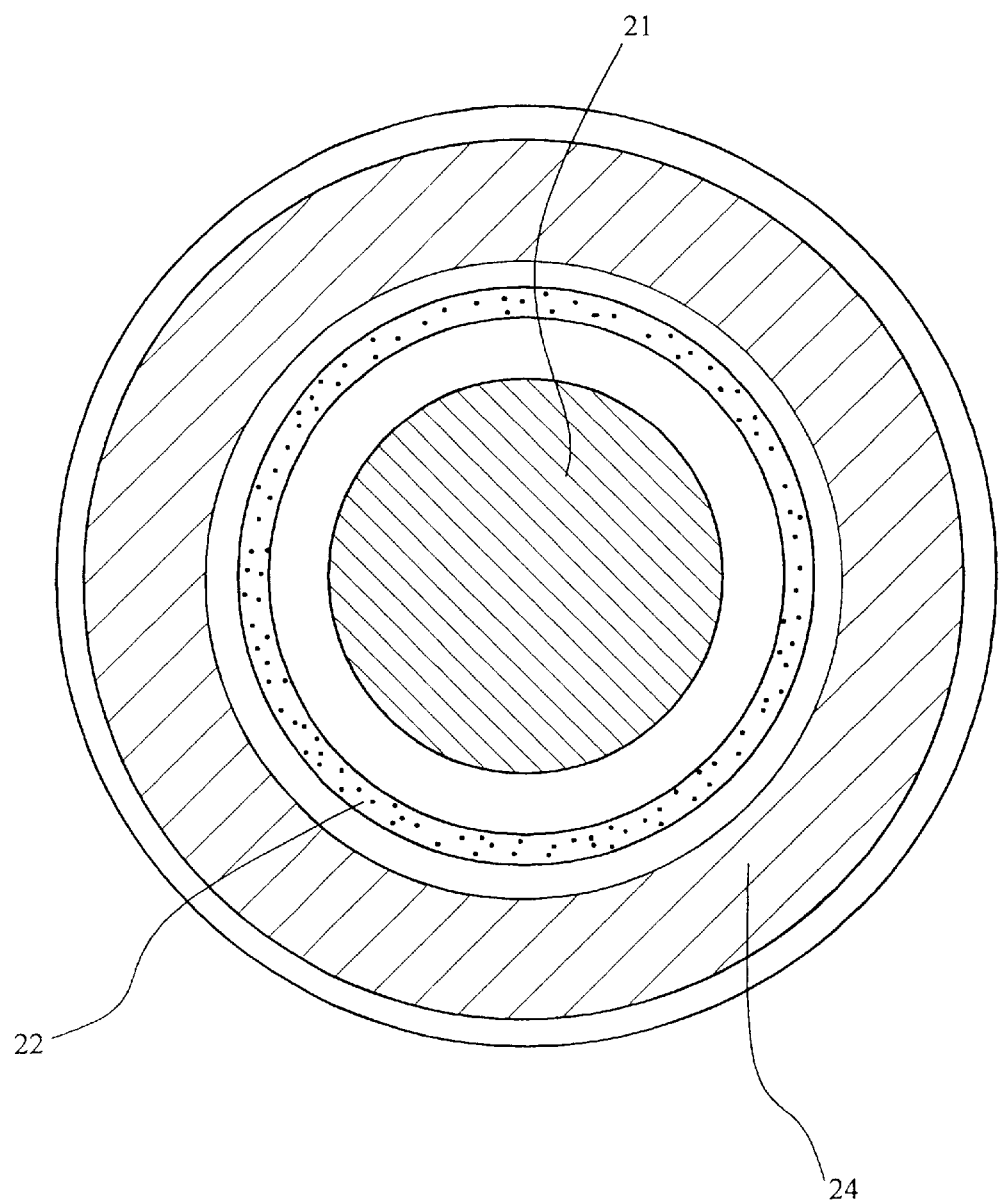
FIG. 4 is a diagram showing the defect distribution within a wafer surface where the R-OSF occurrence position r is (2/3)R.
Figure 5:
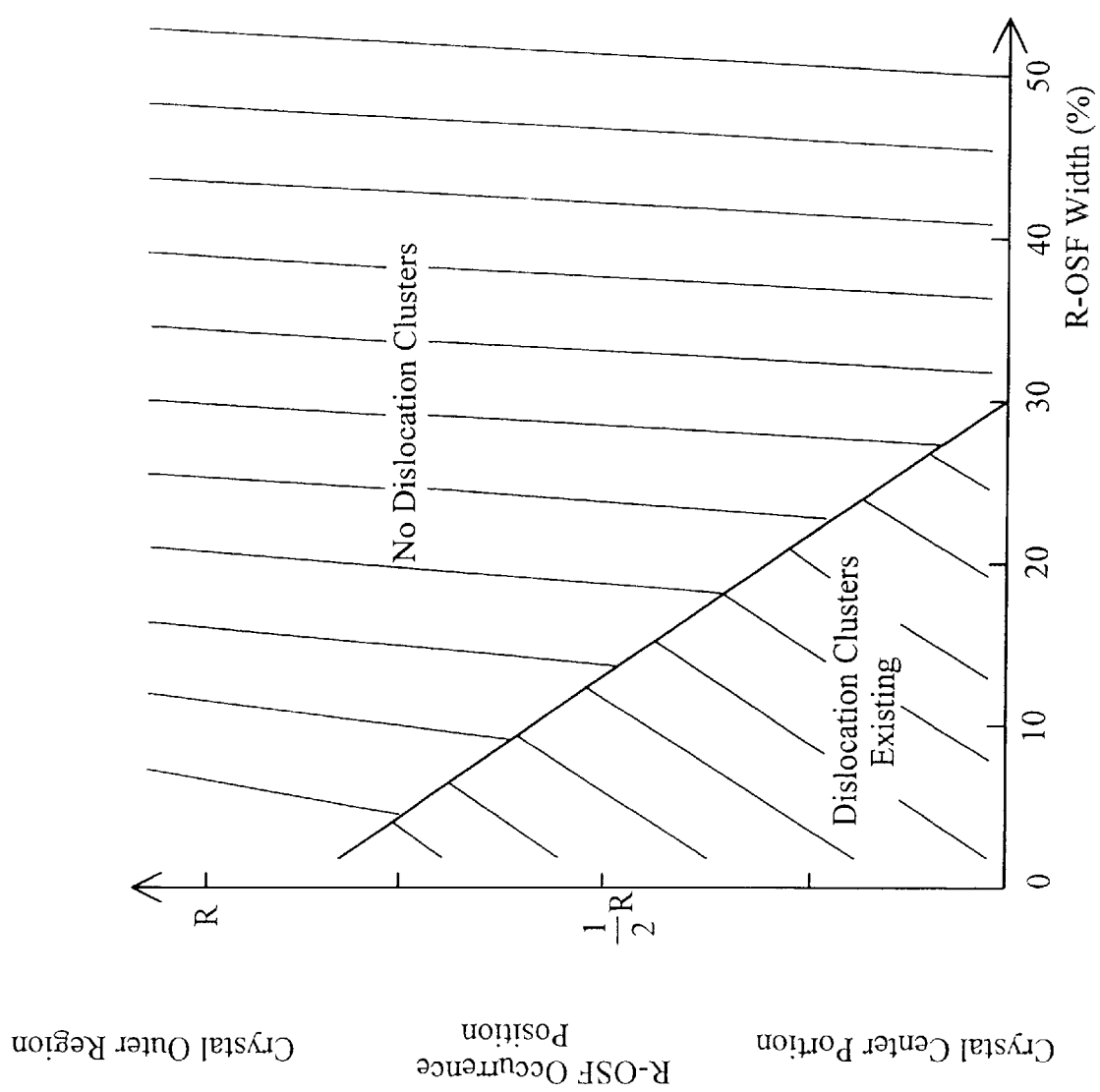
FIG. 5 is a graph indicating the occurrence situation of dislocation clusters on the basis of the relationship between the width of an R-OSF and occurrence position thereof.
Figure 6:
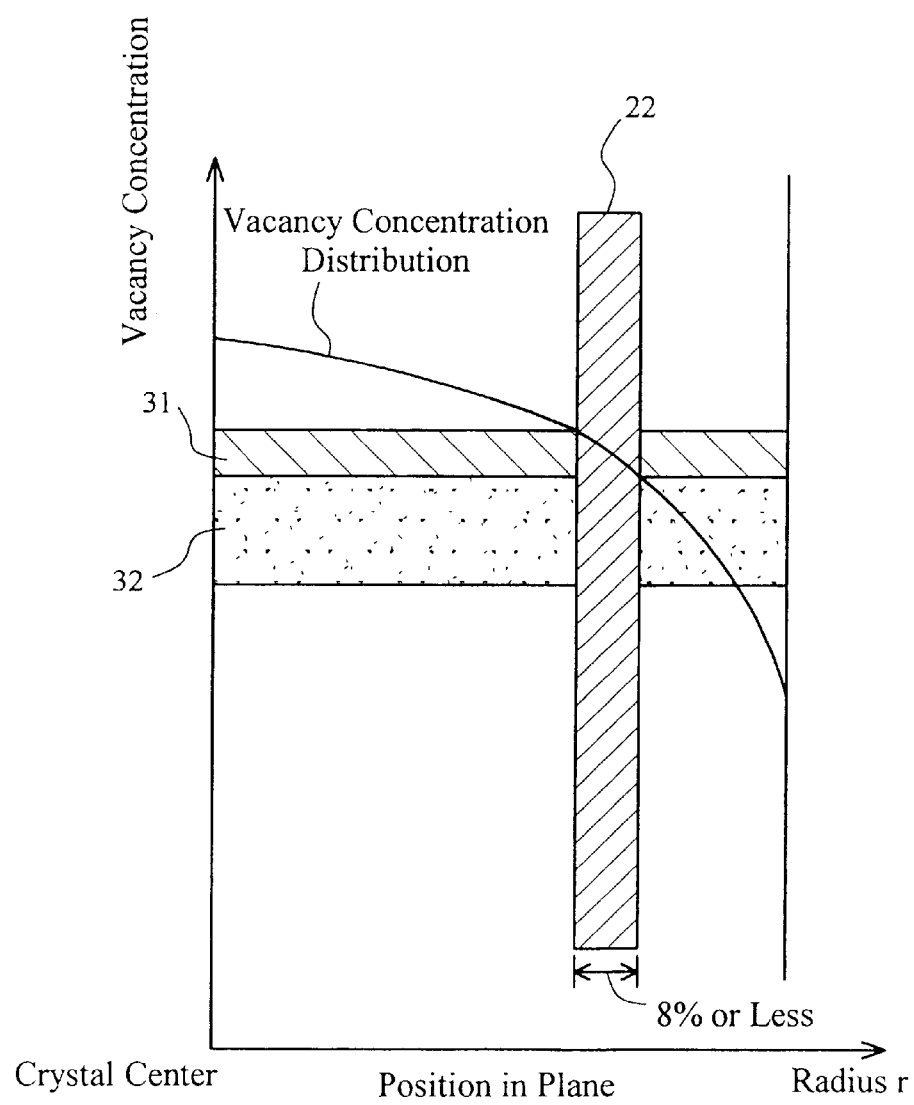
FIG. 6 is a diagram showing the relationship between the concentration distribution of vacancy taken inside a plane of a crystal grown with conventional conditions and width of an R-OSF to be generated.
Figure 7:
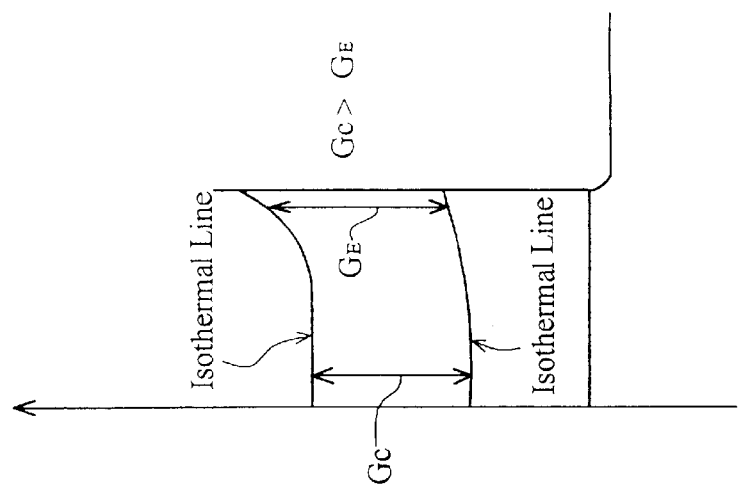
FIGS. 7(a)–7(c) are diagrams showing the relationship between the positions within a crystal plane and temperature distribution.
Figure 7:
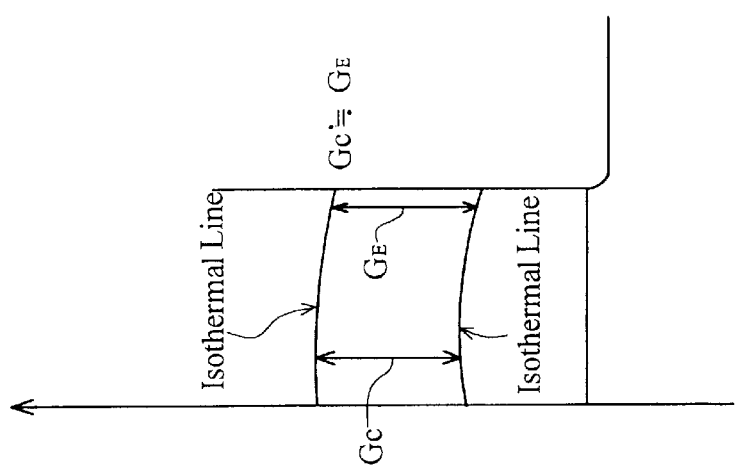
Figure 7:
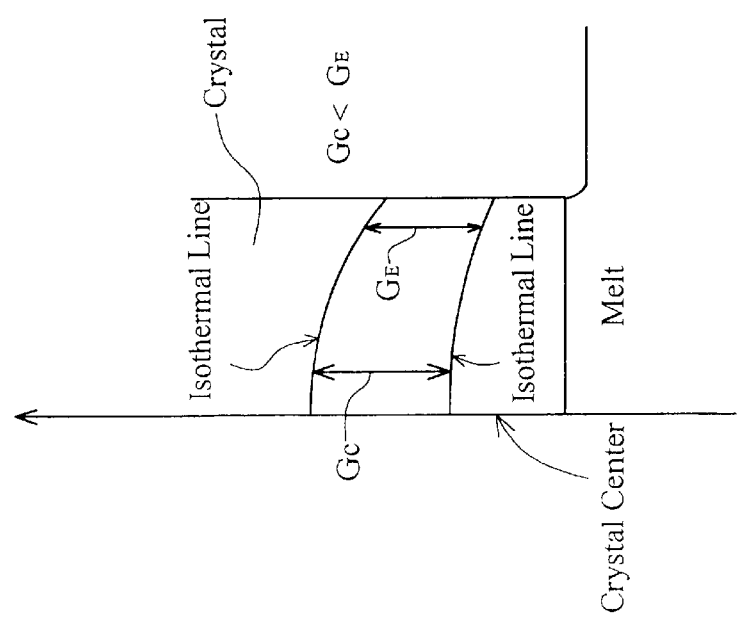
Figure 8:
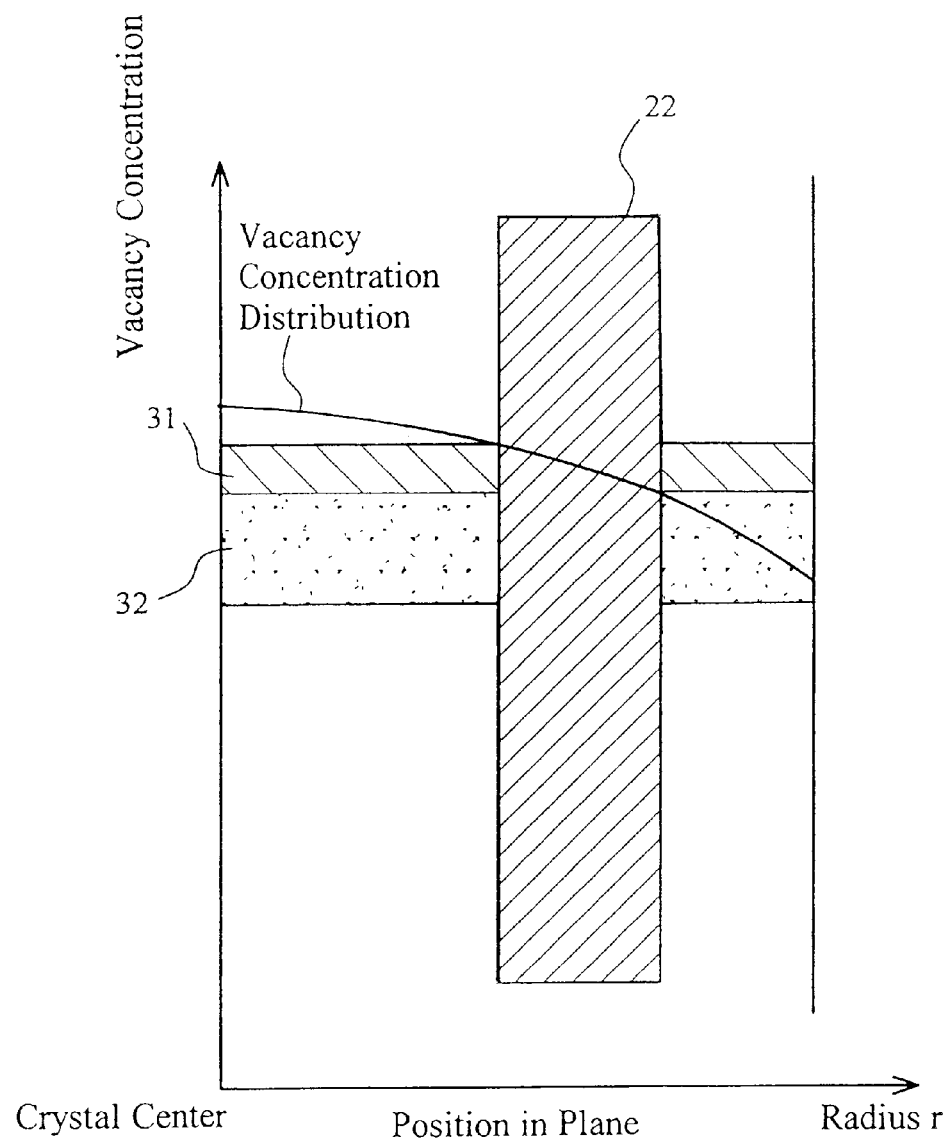
FIG. 8 is a diagram showing the relationship between the concentration distribution of vacancy taken inside a plane of a grown crystal and width of an R-OSF to be generated when the region of the vacancy concentration range where an R-OSF is generated is made larger.
Figure 22:
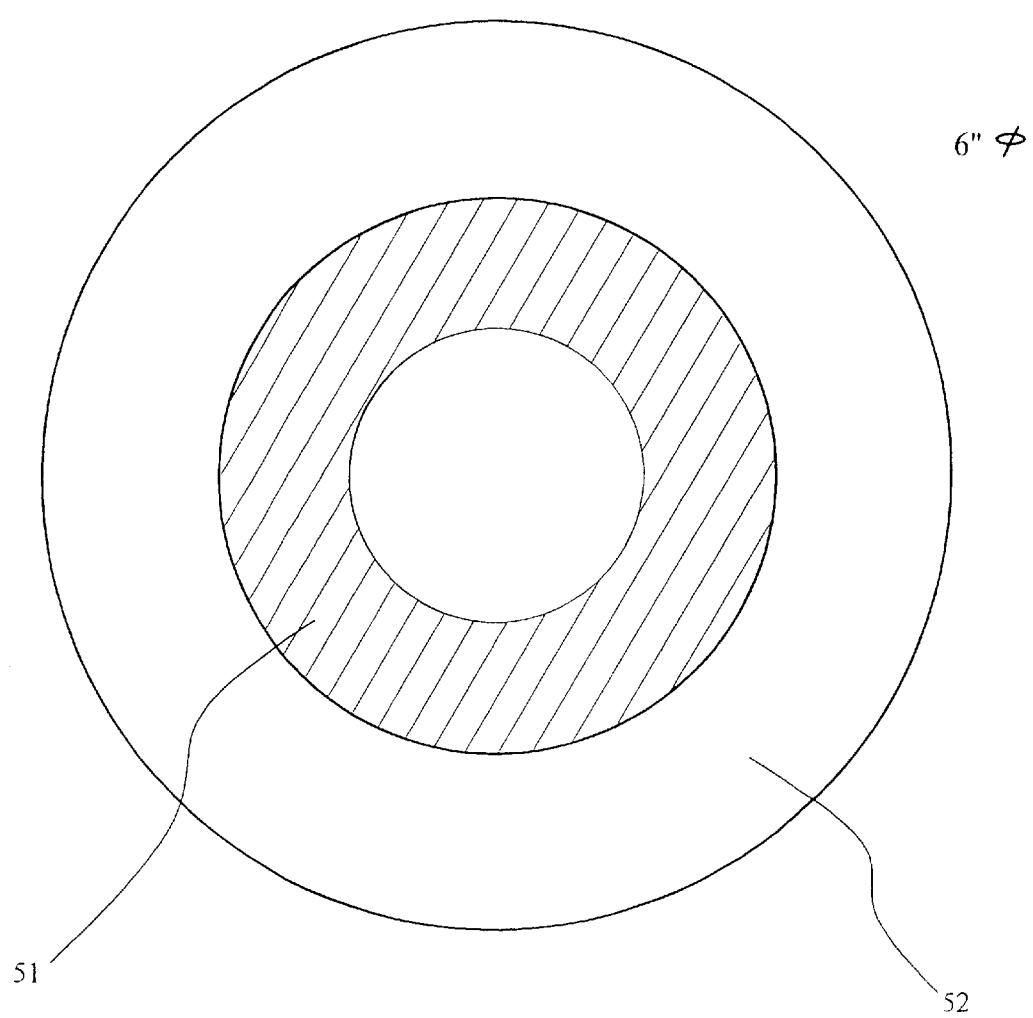
FIG. 22 is a diagram showing the occurrence region of grown-in defects in a single crystal obtained in Example 3.

FIG. 22 is a diagram showing the result from an X-ray topograph taken after a wafer in the as-grown state obtained in the Example 3 was applied with Cu and was heat treated at 900° C. so as to distinguish each defect region. Compared with a conventional crystal (see FIG. 4), it was found that the width of the R-OSF 51 and the defect-free region 52 became much larger. Even when the R-OSF 51 shrank, no dislocation clusters were generated in the outside region of the R-OSF 51.

Figure 23:
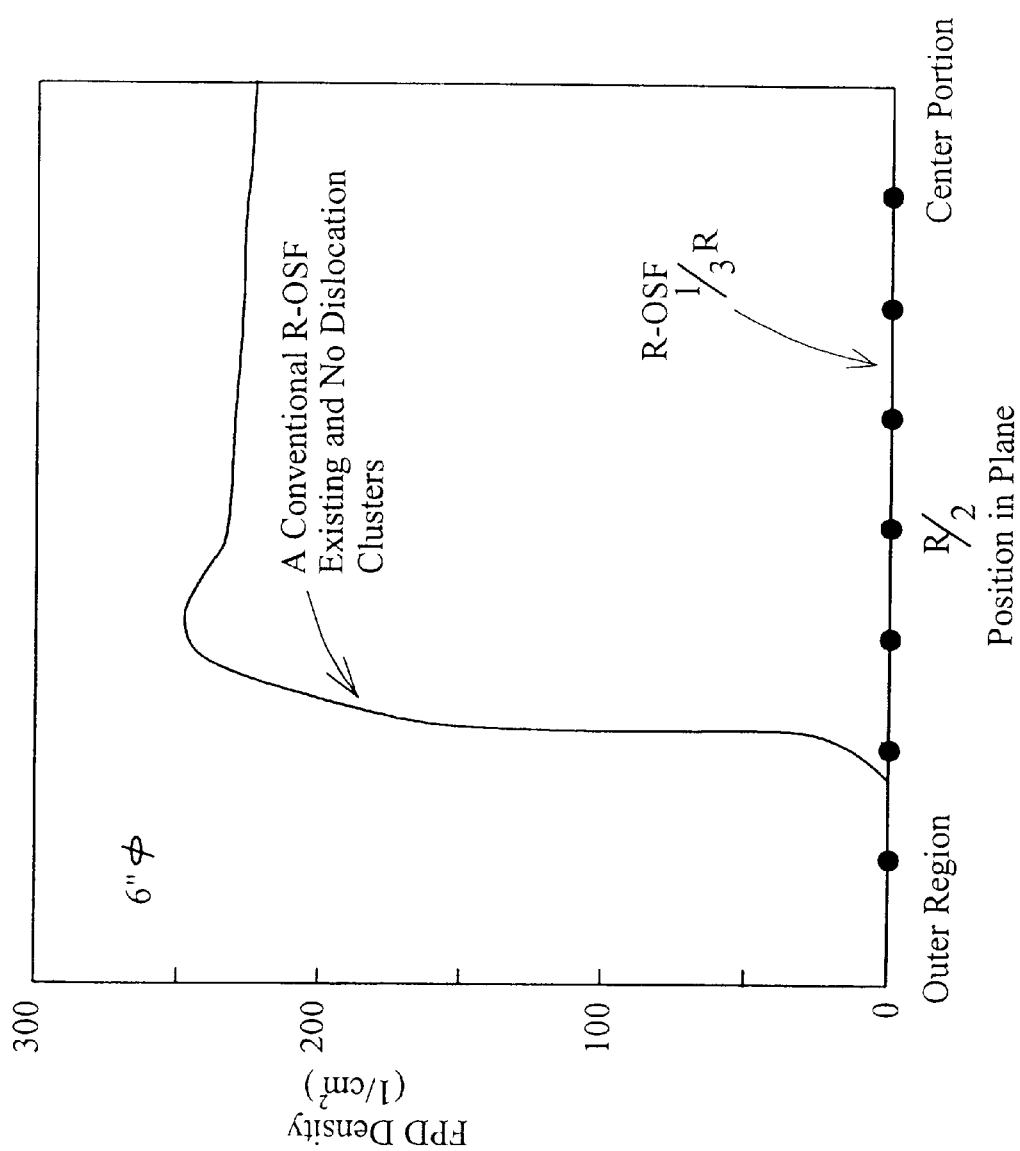
FIG. 23 is a graph indicating the relationship between the R-OSF position within a plane of a crystal in the as-grown state obtained in the Example 3 and distribution density of FP defects.

FIG. 23 is a graph indicating the relationship between the position of an R-OSF within a plane of a crystal in the as-grown state obtained in the Example 3 and distribution density of FP defects. Here, the position of the R-OSF within the plane was observed after Secco etching treatment. As is obvious from FIG. 23. no FP defects were observed. Therefore, it was found that a crystal in which the density of grown-in defects such as infrared scatterers (FPD) and dislocation clusters is extremely small within the crystal plane can be grown by regulating the growth conditions so as to control the width and occurrence position of the R-OSF.

Figure 24:
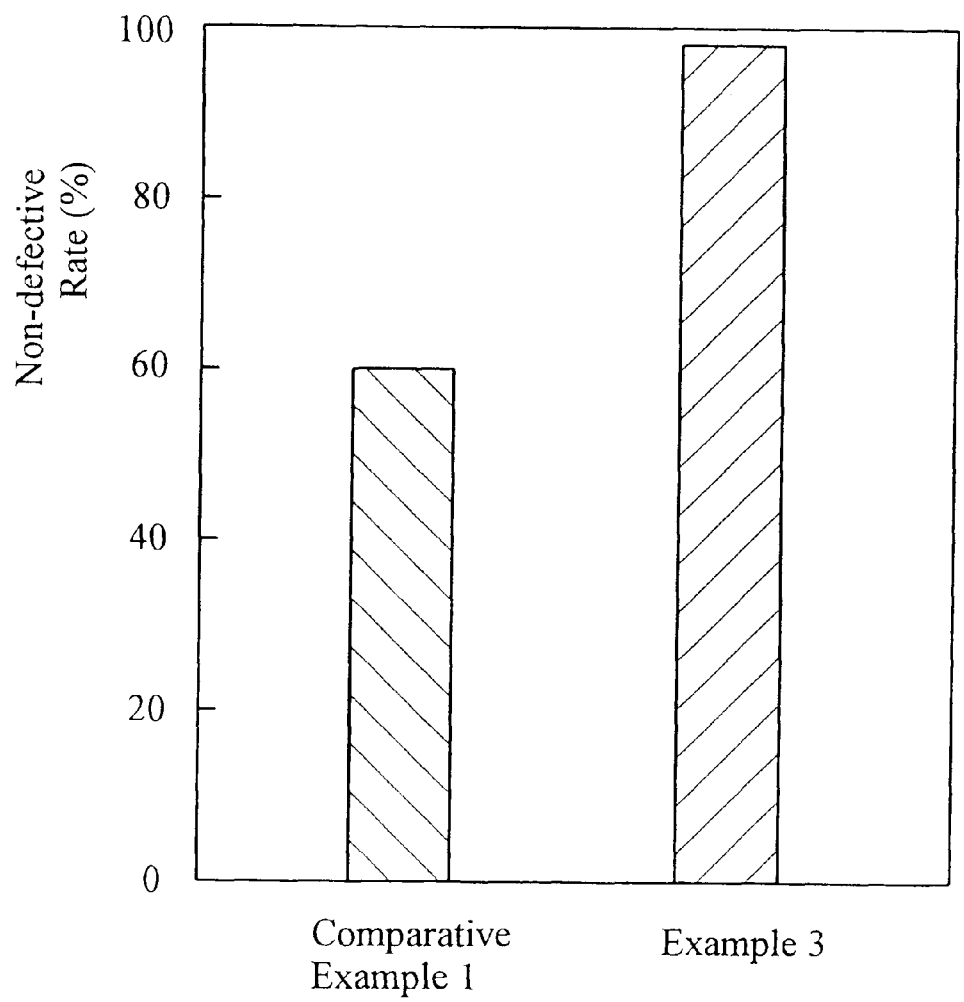
FIG. 24 is a graph indicating the result of the examination of TZDB of single crystal wafers manufactured from a single crystal obtained in the Example 3.

FIG. 24 is a graph indicating the result of the examination of TZDB of single crystal wafers manufactured from a single crystal obtained in the Example 3. Here, the mean non-defective rate in the case where the oxide film thickness was 25 nm and the electric field of 8 MV/cm was applied was found. As Comparative Example 1, using the conventional apparatus for pulling a single crystal shown in FIG. 1, a single crystal having a diameter of 6 inches in which the R-OSF occurrence position r was (1/3)R was grown. The mean non-defective rate of wafers manufactured from the single crystal is also shown. As is obvious from FIG. 24, the non-defective rate of the TZDB in the Comparative Example 1 was 60% or so, while that in the Example 3 was 95% or more.

Example 4

A single crystal 6 having a diameter of 8 inches was pulled in the similar manner to that in the Example 2. Here, the pulling speed was controlled so that the R-OSF occurrence position r was (1/3)R, the body portion 6c was grown to 1000 mm, and the situation of the R-OSF or each defect region was examined.

Figure 25:
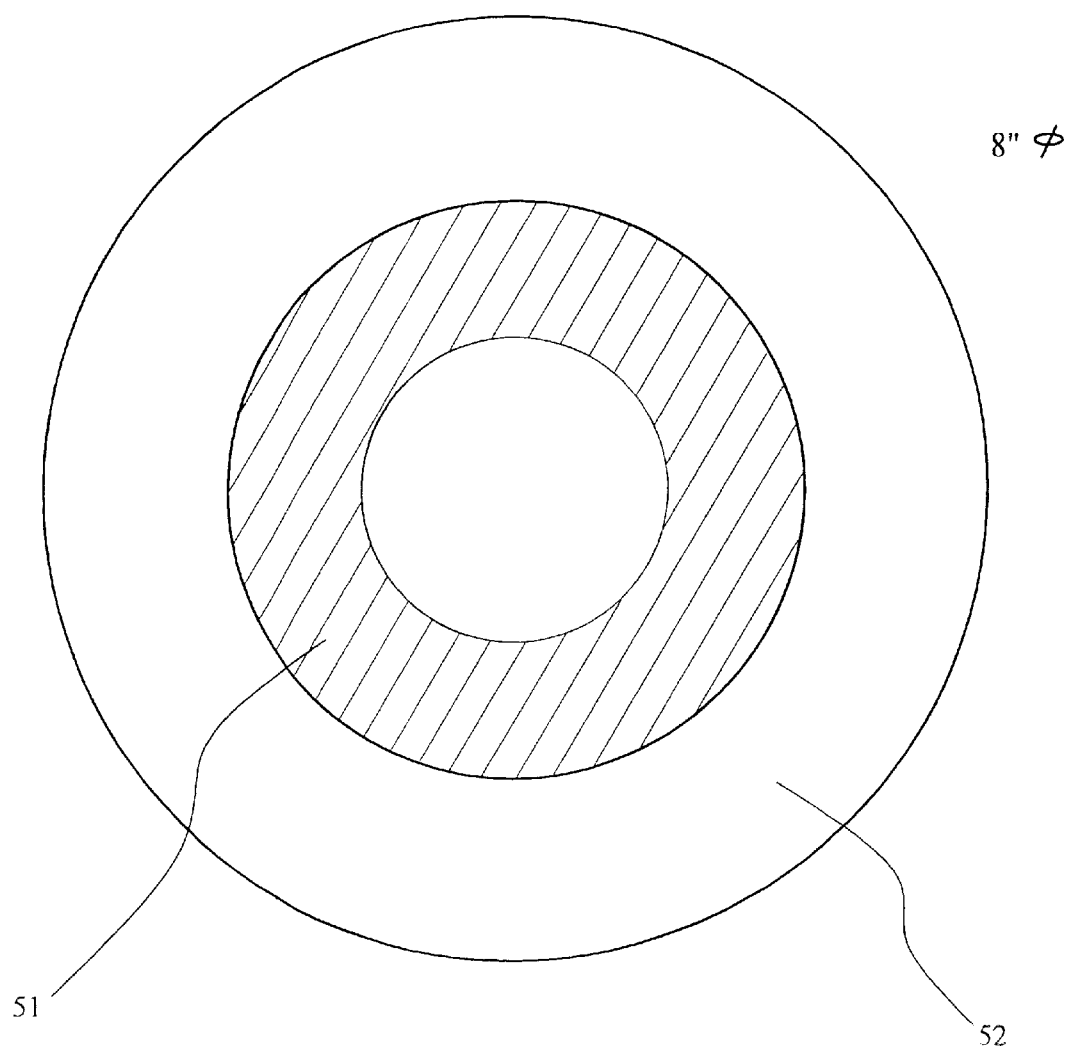
FIG. 25 is a diagram showing the occurrence region of grown-in defects in a single crystal obtained in Example 4.

FIG. 25 is a diagram showing the result from an X-ray topograph taken after a wafer in the as-grown state obtained in the Example 4 was applied with Cu and was heat treated at 900° C. so as to distinguish each defect region. Compared with a conventional crystal (see FIG. 4), it was found that the width of the R-OSF 51 and the defect-free region 52 became much larger. Even when the R-OSF 51 shrank, no dislocation clusters were generated in the outside region of the R-OSF 51.

Figure 26:
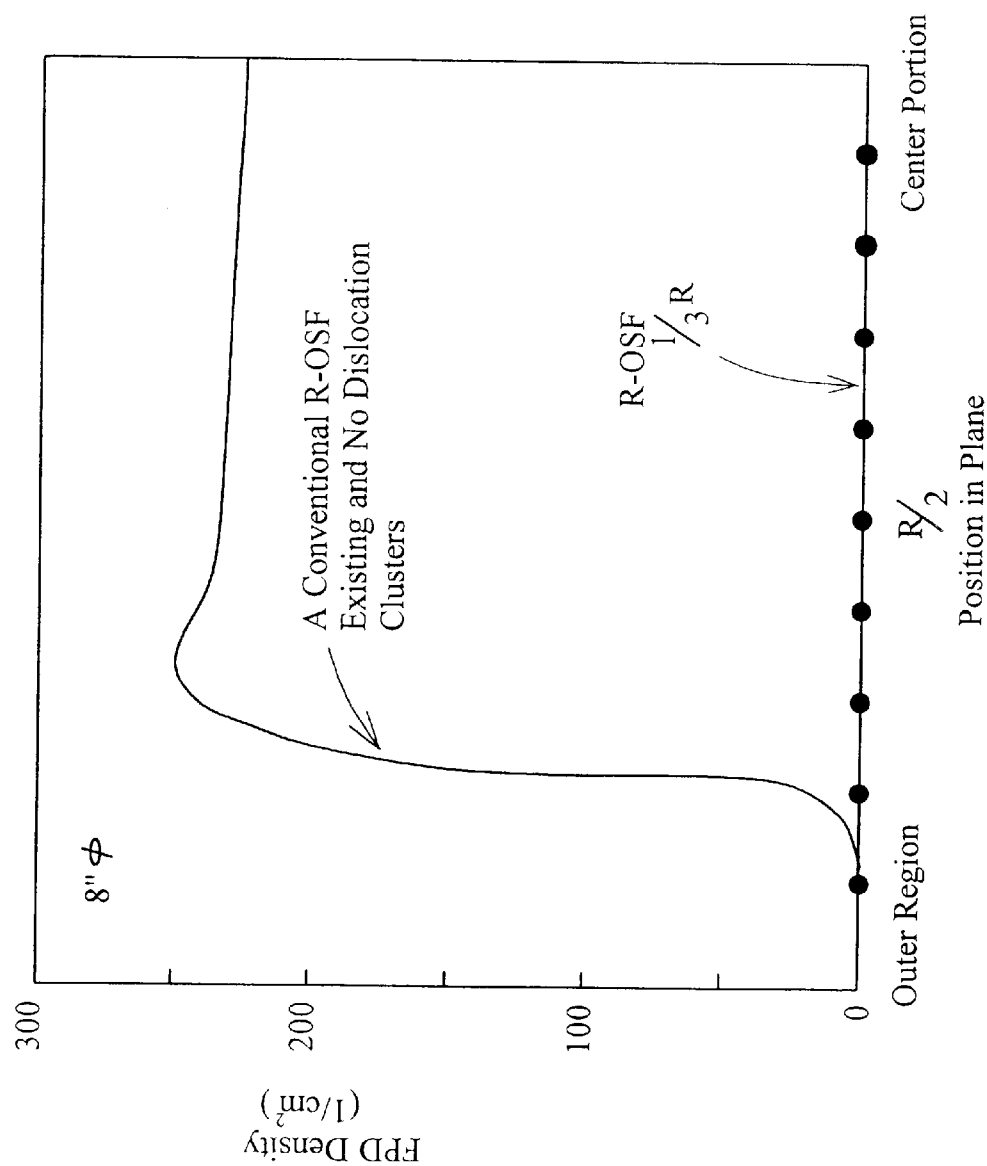
FIG. 26 is a graph indicating the relationship between the R-OSF position within a plane of a crystal in the as-grown state obtained in the Example 4 and distribution density of FP defects.

FIG. 26 is a graph indicating the relationship between the position of an R-OSF within a plane of a crystal in the as-grown state obtained in the Example 4 and distribution density of FP defects. As is obvious from FIG. 26, no FP defects were observed. Therefore, it was found that a crystal in which the density of grown-in defects such as infrared scatterers (FPD) and dislocation clusters is extremely small within the plane thereof can be grown by regulating the growth conditions so as to control the width and occurrence position of the R-OSF.

Figure 27:
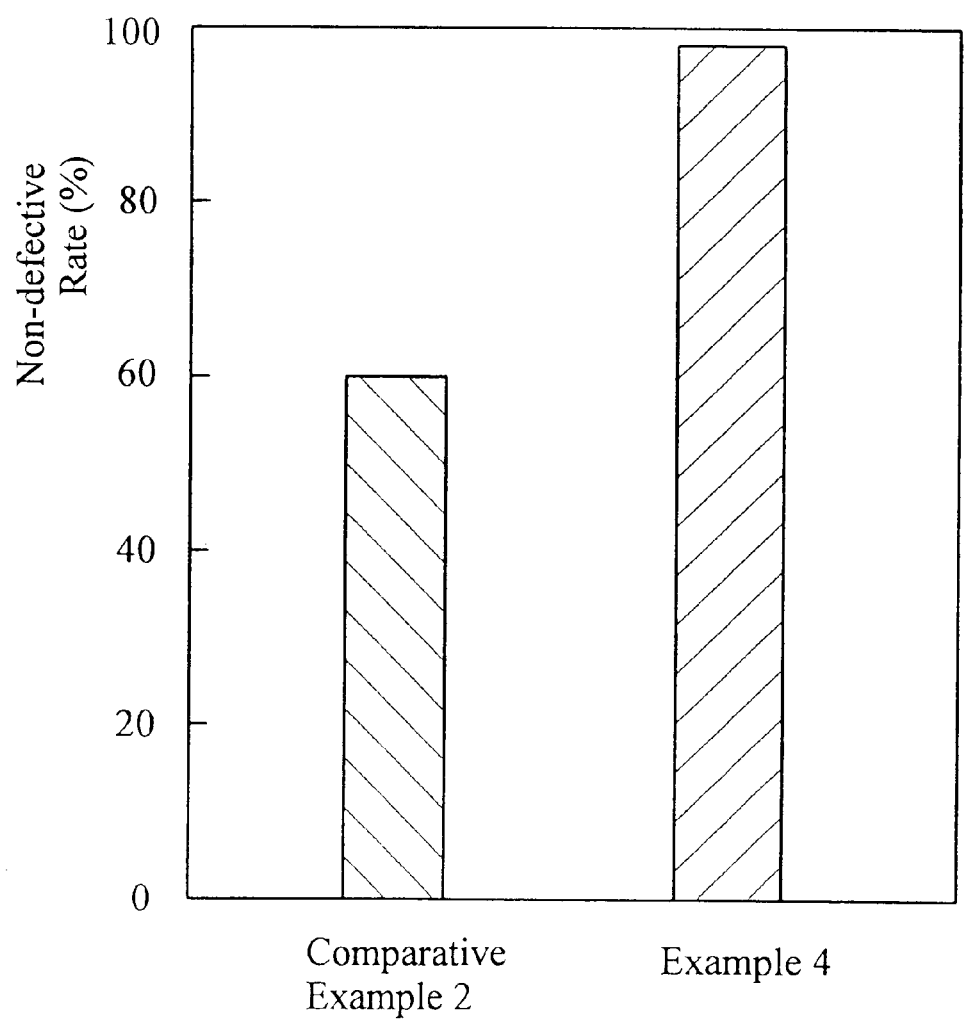
FIG. 27 is a graph indicating the result of the examination of TZDB of single crystal wafers manufactured from a single crystal obtained in the Example 4.

FIG. 27 is a graph indicating the result of the examination of TZDB of single crystal wafers manufactured from a single crystal obtained in the Example 4. Here, the mean non-defective rate in the case where the oxide film thickness was 25 nm and the electric field of 8 MV/cm was applied was found. As Comparative Example 2, using the conventional apparatus for pulling a single crystal shown in FIG. 1, a single crystal having a diameter of 8 inches in which the R-OSF occurrence position r was (1/3)R was grown. The mean non-defective rate of wafers manufactured from the single crystal is also shown. As is obvious from FIG. 27, the non-defective rate of the TZDB in the Comparative Example 2 was 60% or so, while that in the Example 4 was 95% or more.

Example 5

Using the apparatus for pulling a single crystal shown in FIG. 12, a single crystal 6 having a diameter of 8 inches was pulled. At that time, the pulling speed of the single crystal 6 was gradually decreased. Here, the other conditions were the same as those in the Example 2. The distance $h_c$ between the lower end of the straightening vane 11 and the flection 11c was set to 70 mm and the angle θ was set to 45°.

Figure 28:
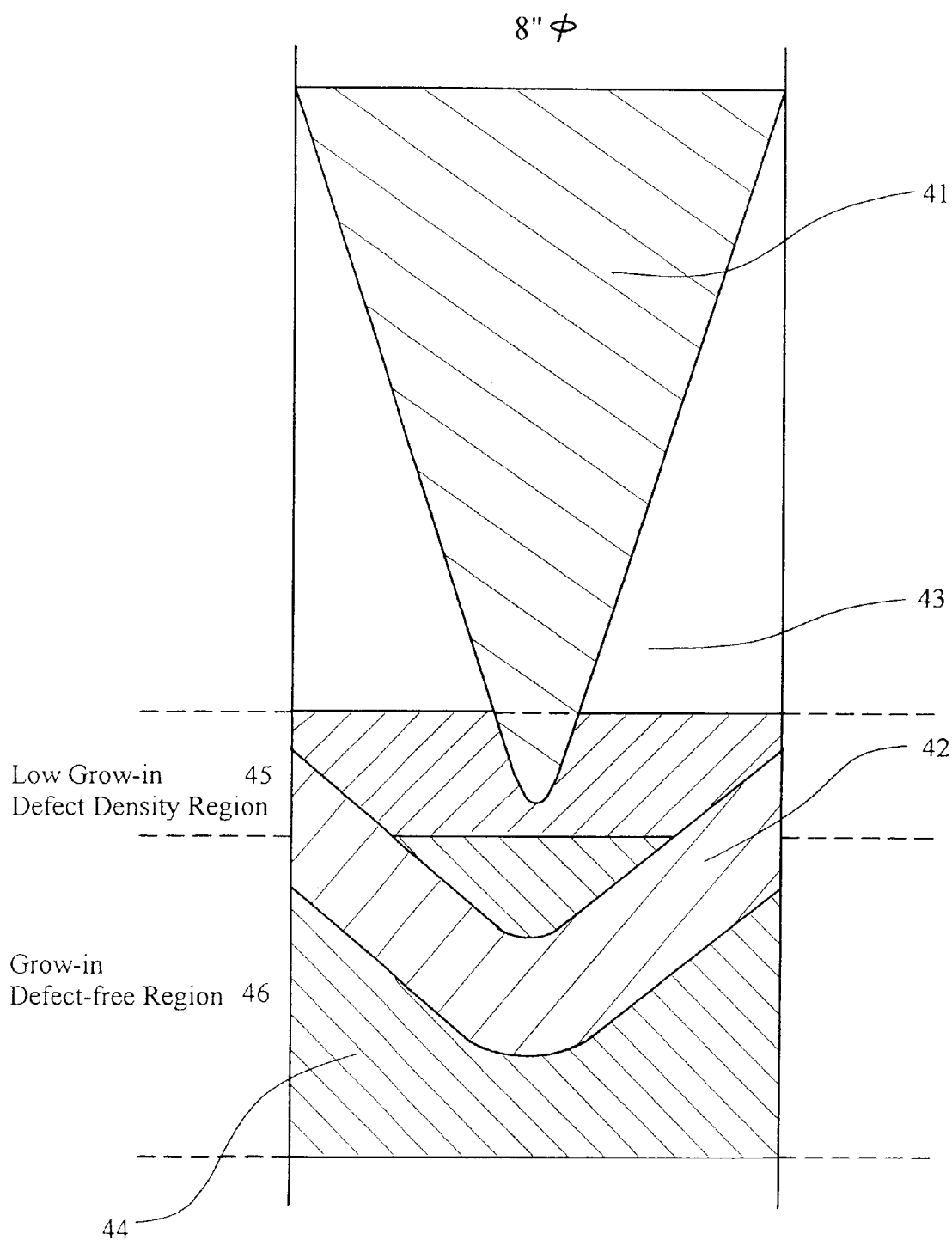
FIG. 28 is a diagram showing the occurrence region of grown-in defects in a single crystal obtained in Example 5.

FIG. 28 is a diagram showing the result from an X-ray topograph taken after a single crystal obtained in the Example 5, which was slivered, was applied with Cu, and was heat treated at 900° C. so as to distinguish each grown-in defect region. Compared with a crystal obtained in the Example 2 (see FIG. 19), it was ascertained that the region of the R-OSF 42 became a gentle convex downward and that the region 45 having a low density of grown-in defects and the region 46 wherein no grown-in defects were generated spread within the crystal plane. Accordingly, it became clear that it is possible to make the density of the grown-in defect region still lower and to increase the region wherein no grown-in defects are generated by growing a crystal at appropriate pulling speeds.

Example 6

Using the apparatus for pulling a single crystal shown in FIG. 14, a single crystal 6 having a diameter of 8 inches was pulled. At that time, the pulling speed of the single crystal 6 was gradually decreased. Here, the other conditions were the same as those in the Example 2.

The main body of a cooling tube 13 called a draw tube had an inner diameter of 300 mm and an overall length of 1200 mm, and was arranged so that the lower end portion thereof was 400 mm away from the melt surface 3a.

Figure 29:
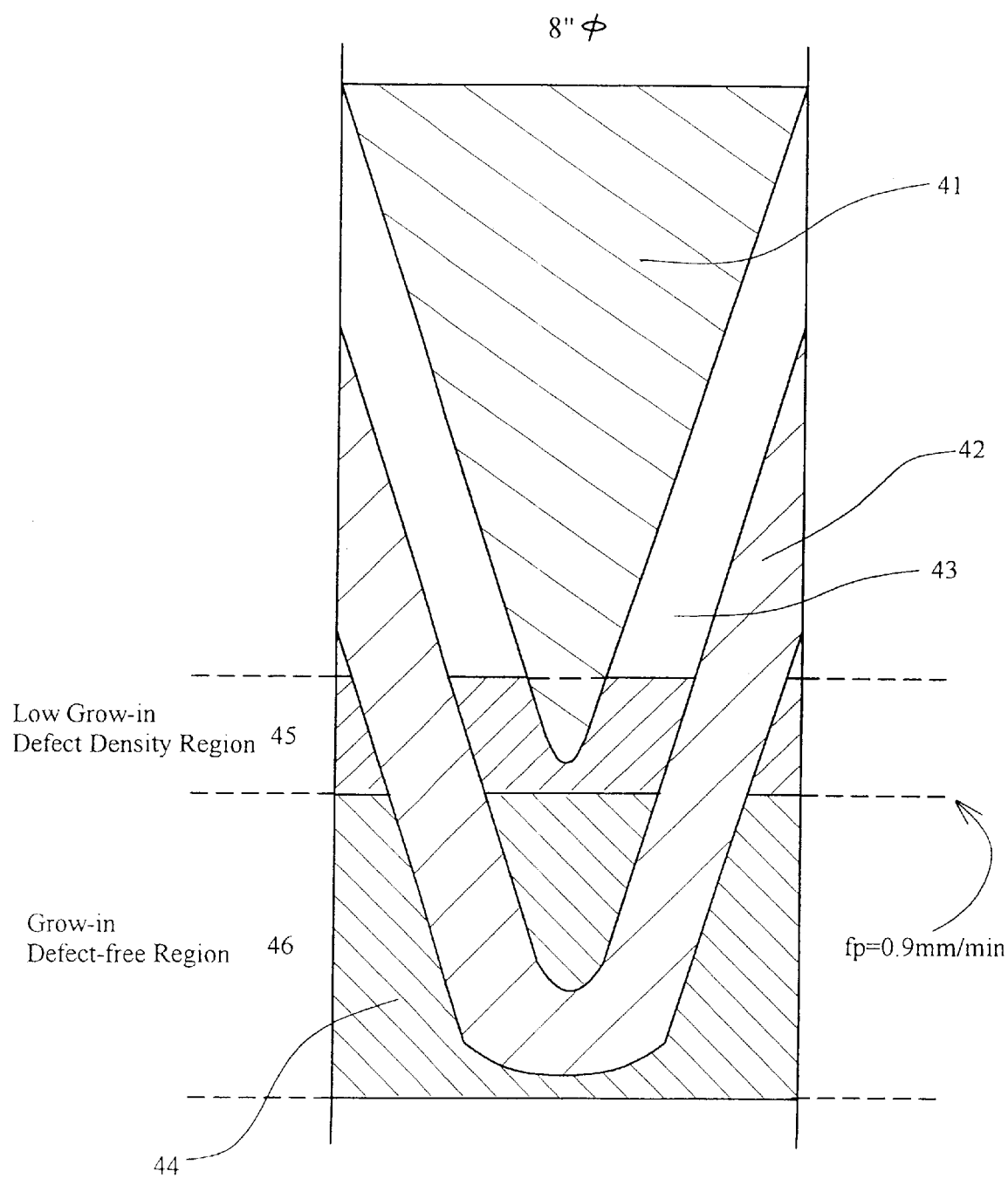
FIG. 29 is a diagram showing the occurrence region of grown-in defects in a single crystal obtained in Example 6.

FIG. 29 is a diagram showing the result from an X-ray topograph taken after a single crystal obtained in the Example 6, which was slivered, was applied with Cu, and was heat treated at 900° C. so as to distinguish each grown-in defect region. When the pulling speed $f_p$ was 0.9 mm/min or less, no grown-in defects were generated. Compared with a crystal obtained in the Example 2 (see FIG. 19), the pulling speed at which the R-OSF 42 occurred became higher on the whole, and the region 45 having a low density of grown-in defects and the region 46 wherein no grown-in defects were generated were shifted to the regions pulled at higher speeds.

Example 7

Using the apparatus shown in FIG. 11, the crucible 1 was charged with polysilicon of 120 kg as a material for forming a crystal, to which boron to be a P-type dopant was added so that the electrical resistivity in the crystal became about 10 Ωcm. After making an Ar atmosphere of about 1300 Pa in the chamber 9, all of the material for forming a crystal was melted by controlling power of the heater 2.

While the power of the heater 2 was controlled, the position of the heater 2 was controlled. Then, the lower end portion of the seed crystal 5 was dipped into the melt 3, and a single crystal 6 having a diameter of 8 inches was pulled while the crucible 1 and the pulling axis 4 were rotated. At that time, the pulling speed of the single crystal 6 was gradually decreased when the length of the body portion 6c reached 100 mm.

Here, the ring width w of the heat shield plate 12 was 90 mm (including the width of the heat insulator D of 80 mm), and the thickness t thereof was 20 mm (including the thickness of the heat insulator D of 10 mm). The distance h between the bottom surface of the heat shield plate 12 and the melt surface 3a was set to 150 mm.

Figure 30:
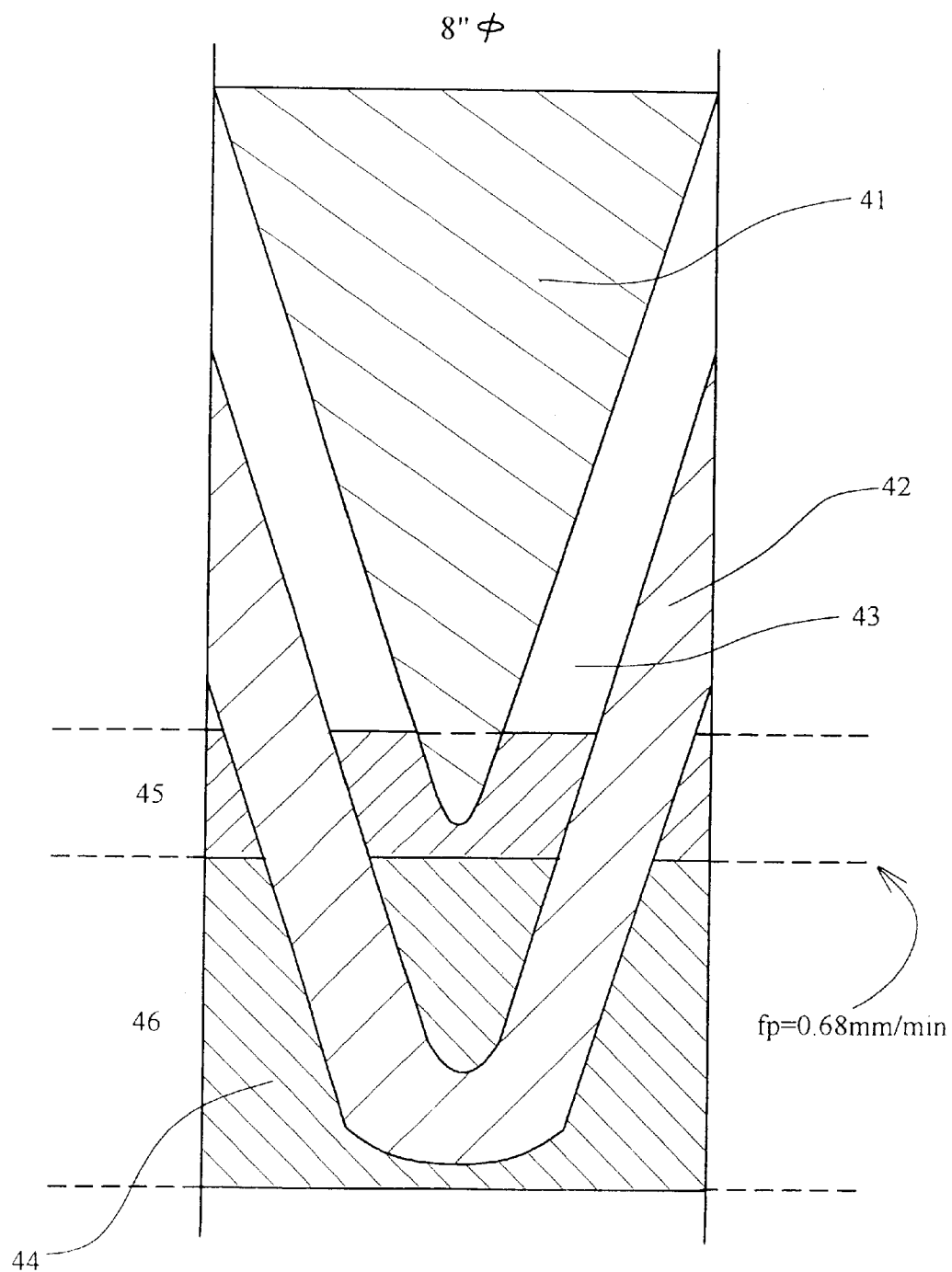
FIG. 30 is a diagram showing the occurrence region of grown-in defects in a single crystal obtained in Example 7.

FIG. 30 is a diagram showing the result from an X-ray topograph taken after a single crystal obtained in the Example 7, which was slivered, was applied with Cu, and was heat treated at 900° C. so as to distinguish each grown-in defect region. Reference numerals 41 and 43 in the figure represent a region where FP defects are generated and a region where no FP defects are generated, respectively.

The width of the R-OSF 42 was about 40 mm (about 40% of the radius of the single crystal 6). It was ascertained that the width of the R-OSF became much larger, compared with the width of the R-OSF in a conventional single (crystal 8% maximum). About 40% or more of the radius of the 8-inch single crystal was within the R-OSF 42 region. Even if the occurrence position of the R-OSF 42 moved inward, no dislocation clusters were generated (44 in the figure) outside the R-OSF 42 since the width of the R-OSF was large. Even when the R-OSF 42 disappeared on the inside of the single crystal 6, no dislocation clusters were generated. Regions 45 and 46 represent a region having a low density of grown-in defects and a region wherein no grown-in defects were detected, respectively.

Figure 31:
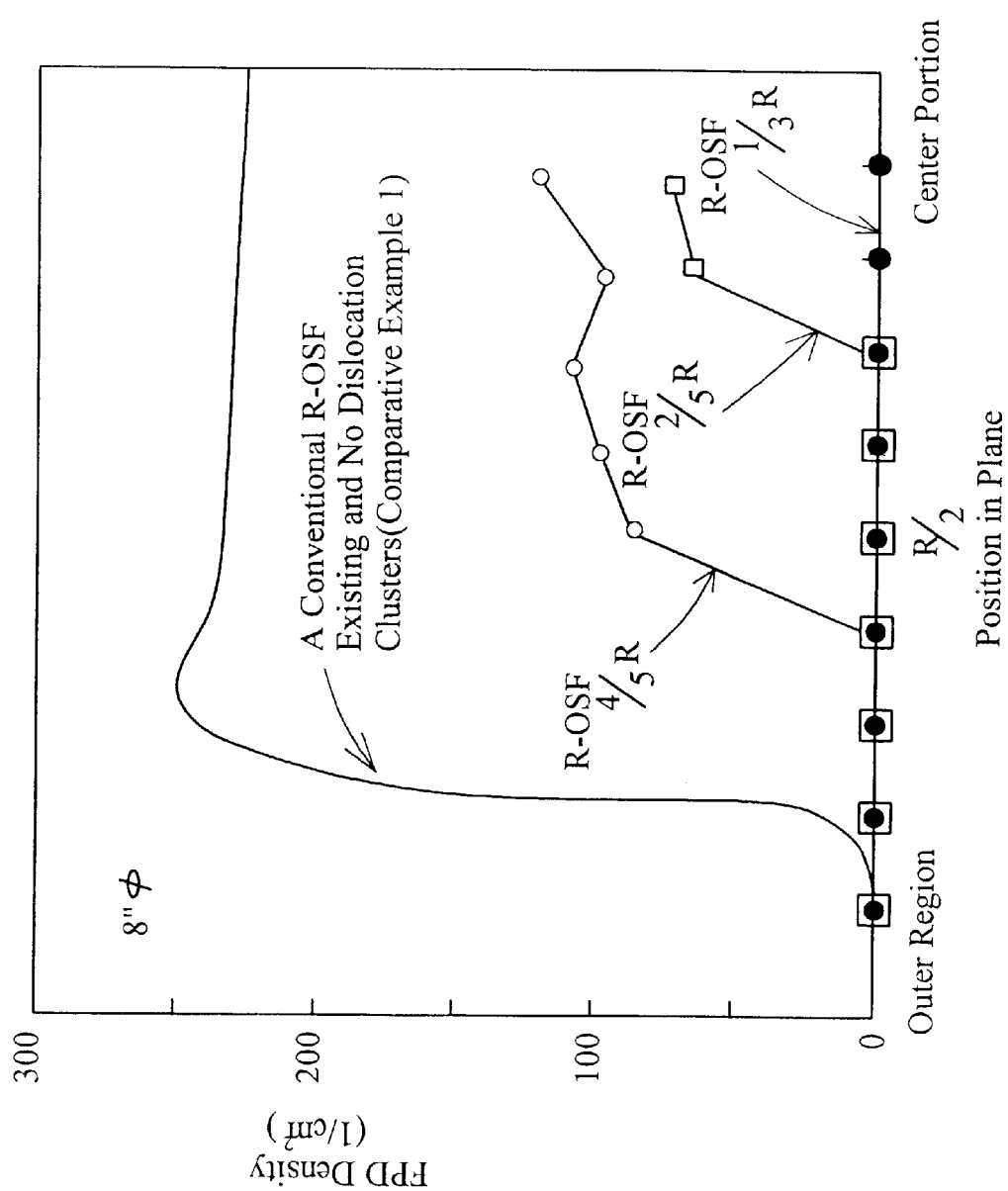
FIG. 31 is a graph indicating the relationship between the R-OSF position within a plane of a crystal in the as-grown state obtained in the Example 7 and distribution density of FP defects.

FIG. 31 is a graph indicating the relationship between the position of an R-OSF 42 within a plane of a crystal in the as-grown state obtained in the Example 7 and distribution density of FP defects. Here, the position of the R-OSF 42 within the plane was observed after Secco etching treatment. The width of the R-OSF 42 was 40 mm, which was about 39% of the crystal radius. As is obvious from FIG. 31, where the position r of the R-OSF 42 within the plane was (2/5)R, FP defects were observed in the center portion of the crystal. But where r=(1/3)R, no FP defects were observed. Therefore, it was ascertained that a crystal in which grown-in defects such as infrared scatterers (FPD) and dislocation clusters are not observed within the plane thereof can be grown by regulating the growth conditions so as to control the width and occurrence position of the R-OSF.

Figure 32:
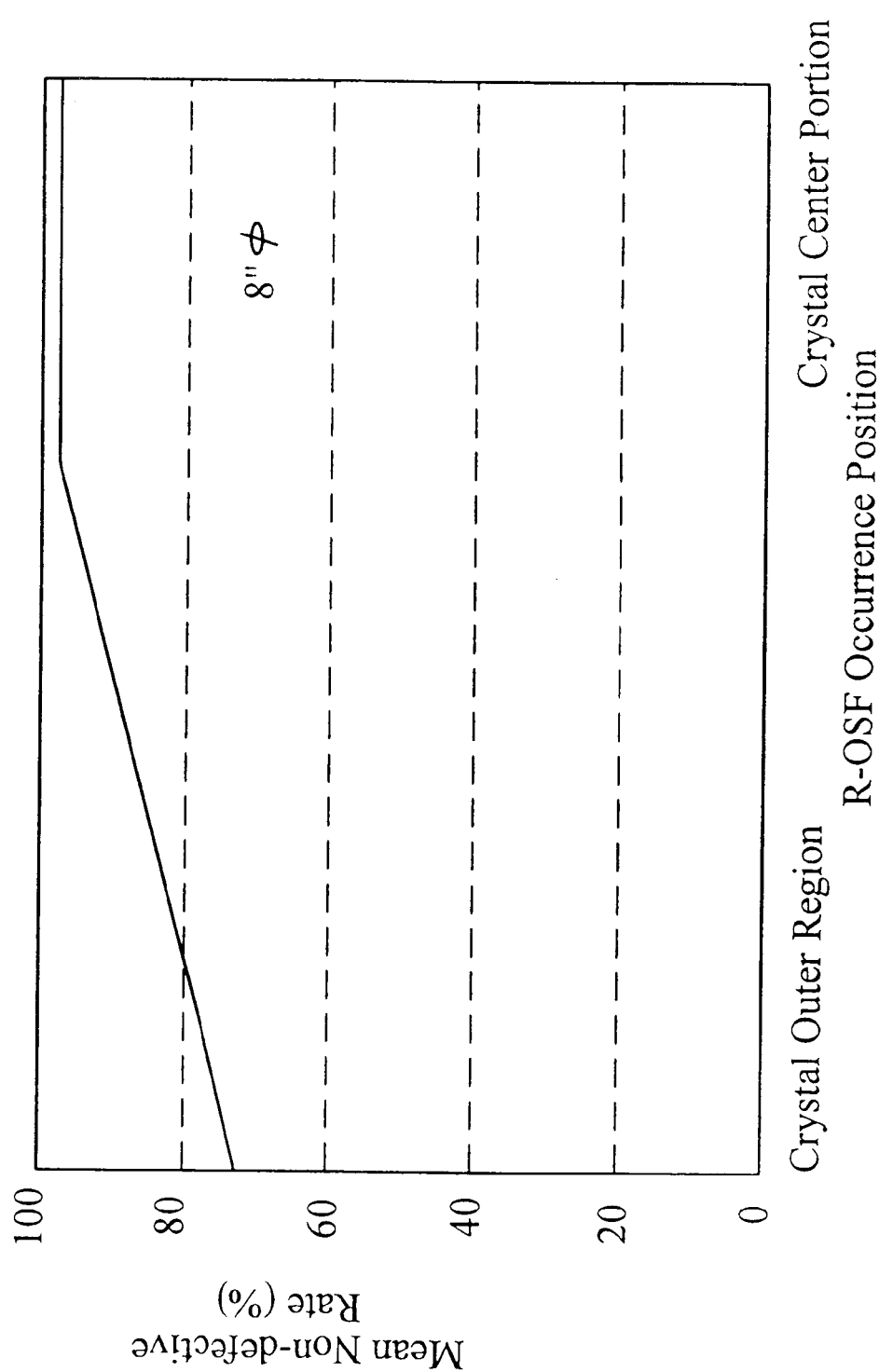
FIG. 32 is a graph indicating the result of the examination of TZDB of single crystal wafers manufactured from a single crystal obtained in the Example 7.

FIG. 32 is a graph indicating the result of the examination of time zero dielectric breakdown (TZDB) of single crystal wafers manufactured from a single crystal obtained in the Example 7, which shows the mean non-defective rates to the occurrence positions of the R-OSF. Here, the mean non-defective rates in the case where the oxide film thickness was 25 nm and the electric field of 8 MV/cm was applied were found. As is obvious from FIG. 32, the non-defective rate of the TZDB in the case where the R-OSF occurrence position r was (1/3)R and the FPD density within the plane was extremely small was 95% or more.

Example 8

In order to ascertain the effect of a straightening vane 11 including no heat insulator, using the apparatus wherein no heat insulator was embedded in the lower part of the straightening vane 11 below the position at which the heat shield plate was arranged in the apparatus shown in FIG. 11, the experiment was conducted with the other conditions which were the same as those in the Example 7.

As a result, the same effect as that in the Example 5 could be obtained. Compared with a crystal obtained in the Example 2 (see FIG. 19), it was ascertained that the region of the R-OSF 42 had a shape of a gentle convex downward and that the region 45 having a low density of grown-in defects and the region 46 wherein no grown-in defects were generated spread within the crystal plane. Accordingly, it became clear that it is possible to make the density of the grown-in defect region still lower and to increase the region wherein no grown-in defects are generated by growing a crystal at appropriate pulling speeds.

Example 9

Using the apparatus for pulling a single crystal shown in FIG. 15, a single crystal 6 having a diameter of 8 inches was pulled. At that time, the pulling speed of the single crystal 6 was gradually decreased. The other conditions were the same as those in the Example 7.

The main body of a cooling tube 13 called a drawtube had an inner diameter of 300 mm and an overall length of 1200 mm, and was arranged so that the lower end portion thereof was 400 mm away from the melt surface 3a.

Figure 33:
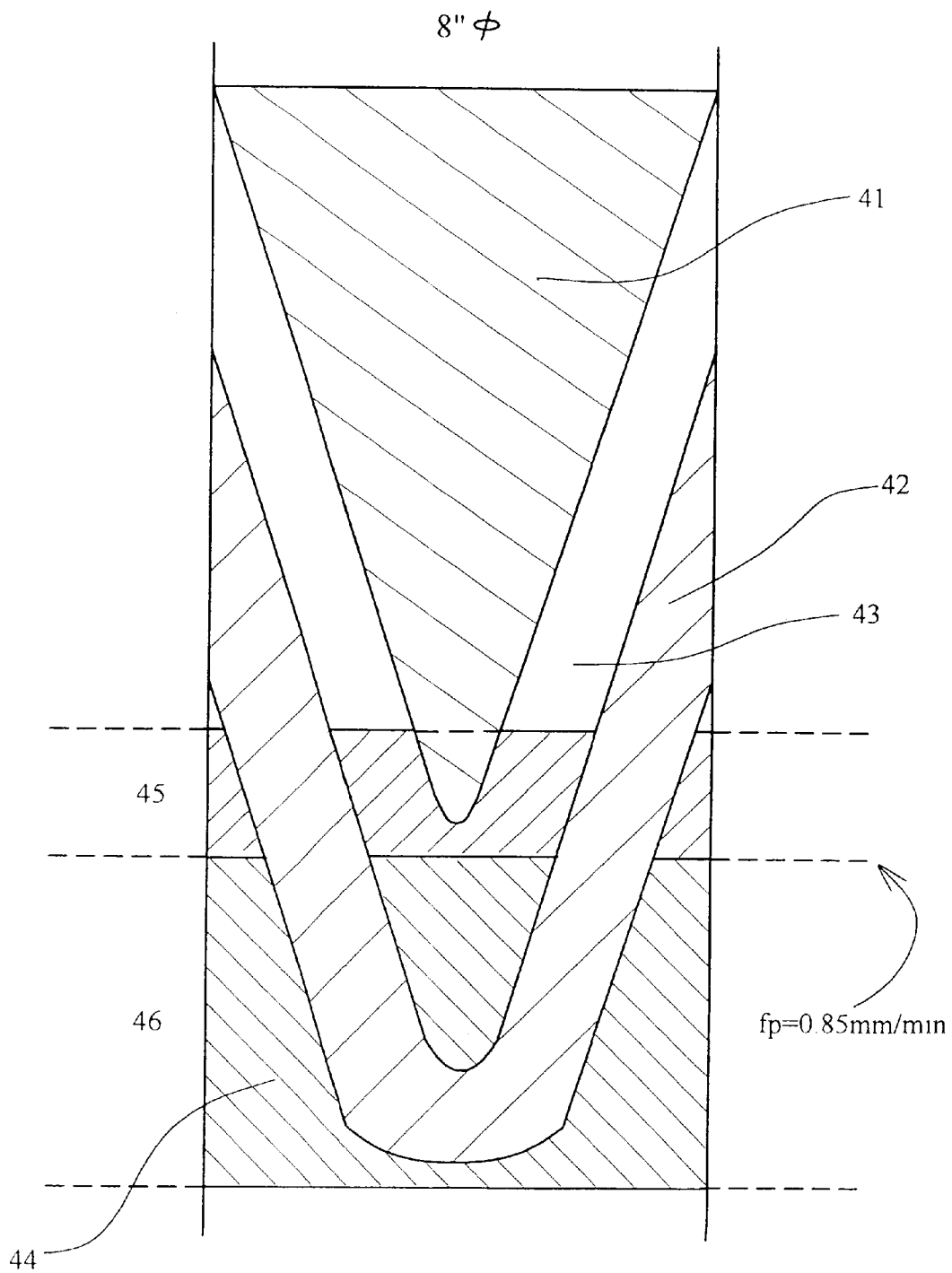
FIG. 33 is a diagram showing the occurrence region of grown-in defects in a single crystal obtained in Example 9.

FIG. 33 is a diagram showing the result from an X-ray topograph taken after a single crystal obtained in the Example 9, which was slivered, was applied with Cu, and was heat treated at 900° C. so as to distinguish each grown-in defect region. When the pulling speed $f_p$, was 0.85 mm/min or less, no grown-in defects were generated. Compared with a crystal obtained in the Example 7 (0.68 mm/min), the pulling speed was shifted to a higher pulling speed.

Figure 34:
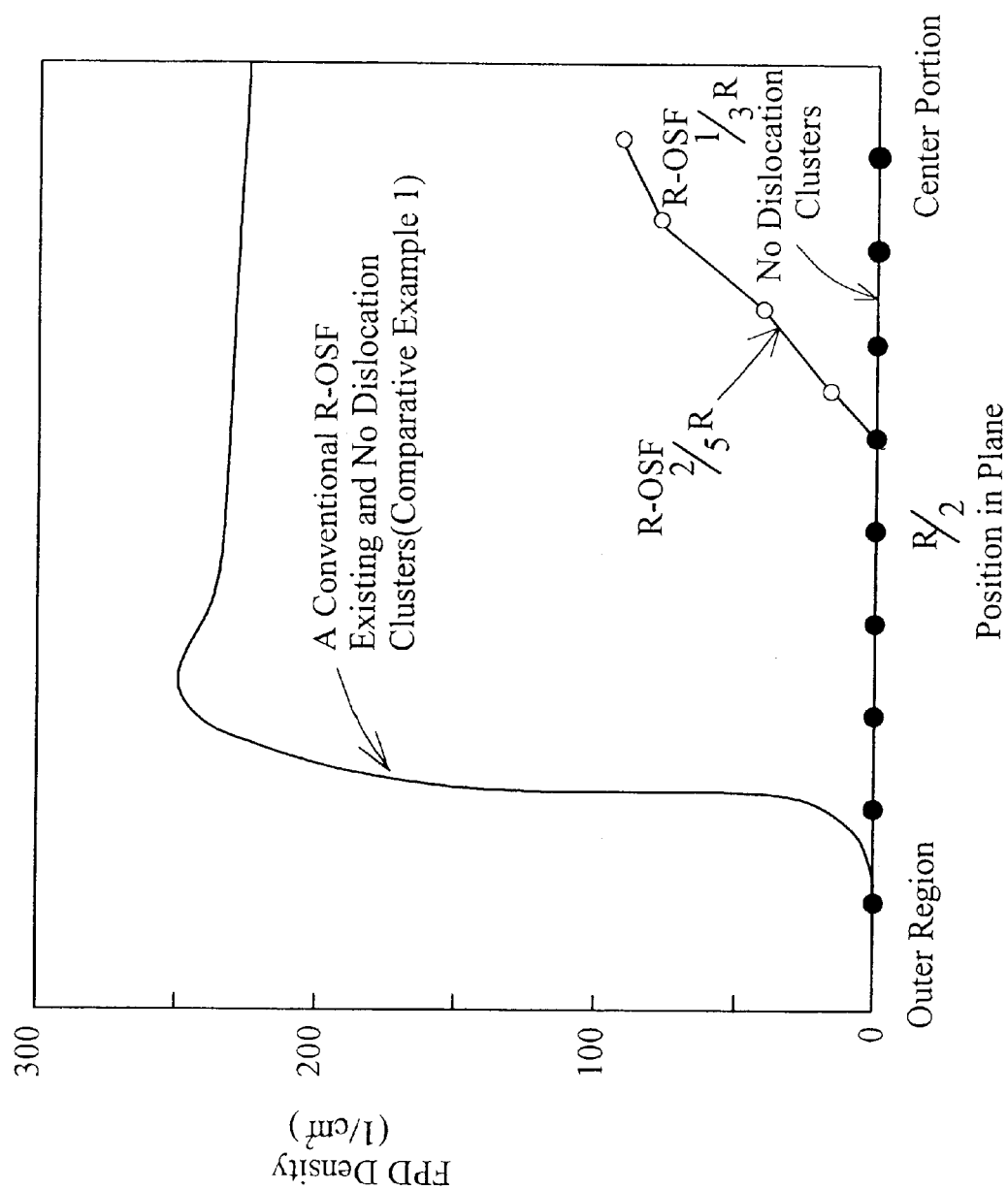
FIG. 34 is a graph indicating the relationship between the R-OSF position within a plane of a crystal in the as-grown state obtained in the Example 9 and distribution density of FP defects.

FIG. 34 is a graph indicating the relationship between the position of an R-OSF 42 within a plane of a crystal in the as-grown state obtained in the Example 9 and distribution density of FP defects. Here, the position of the R-OSF 42 within the plane was observed after Secco etching treatment. The width of the R-OSF 42 was 40 mm, which was about 39% of the crystal radius. As is obvious from FIG. 34, where the position r of the R-OSF 42 within the plane was (1/3)R, no FP defects were observed. Therefore, it was ascertained that a crystal in which grown-in defects such as infrared scatterers (FPD) and dislocation clusters are not observed within the plane thereof can be grown by regulating the growth conditions so as to control the width and occurrence position of the R-OSF.

Figure 35:
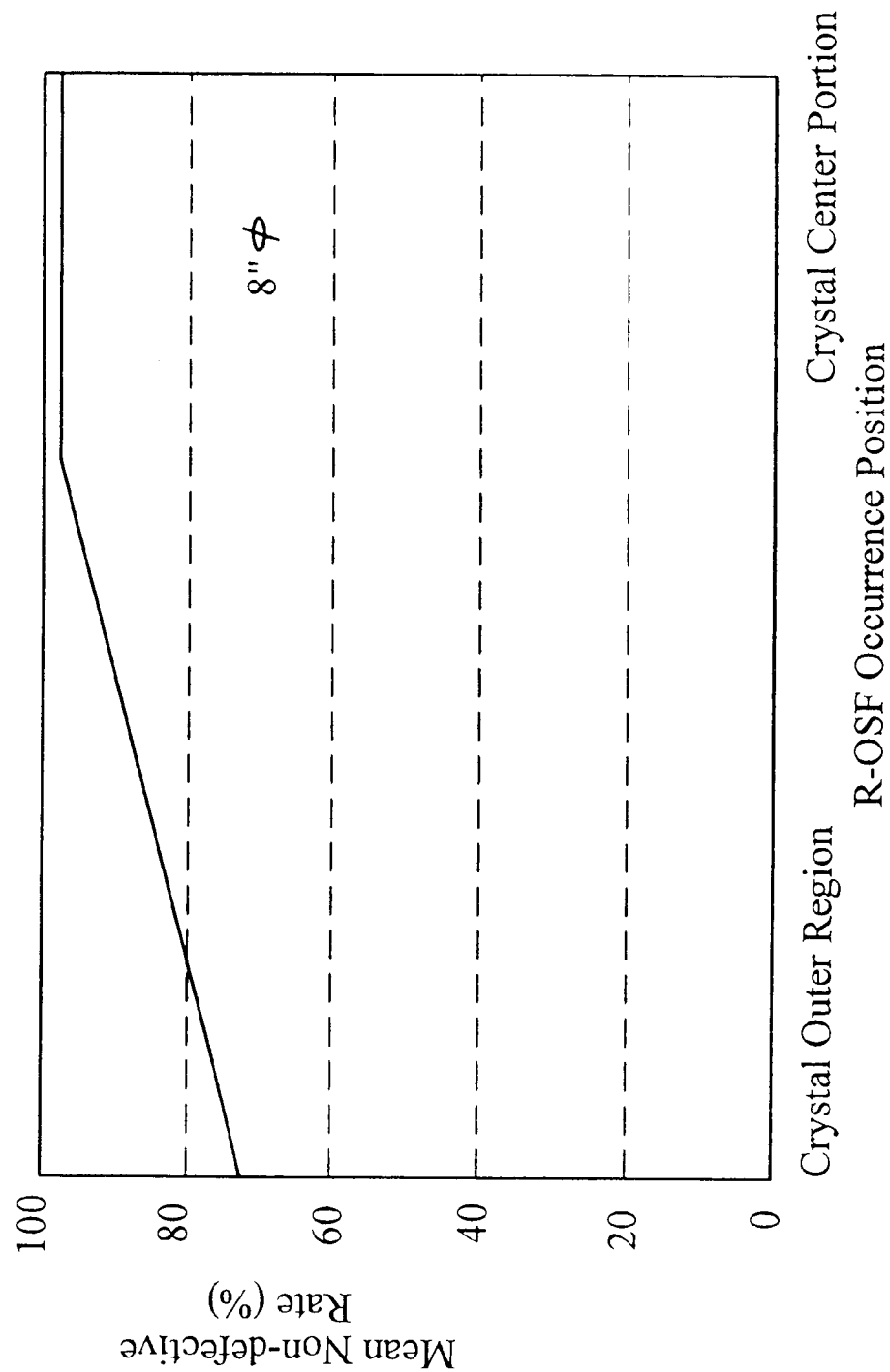
FIG. 35 is a graph indicating the result of the examination of TZDB of single crystal wafers manufactured from a single crystal obtained in the Example 9.

FIG. 35 is a graph indicating the result of the examination of TZDB of single crystal wafers manufactured from a single crystal obtained in the Example 9, which shows the mean non-defective rates to the R-OSF occurrence positions r. As is obvious from FIG. 35, the non-defective rate of the TZDB in the case where the R-OSF occurrence position r was (1/3)R and the FPD density within the plane was extremely small was 95% or more.

Figure 36:
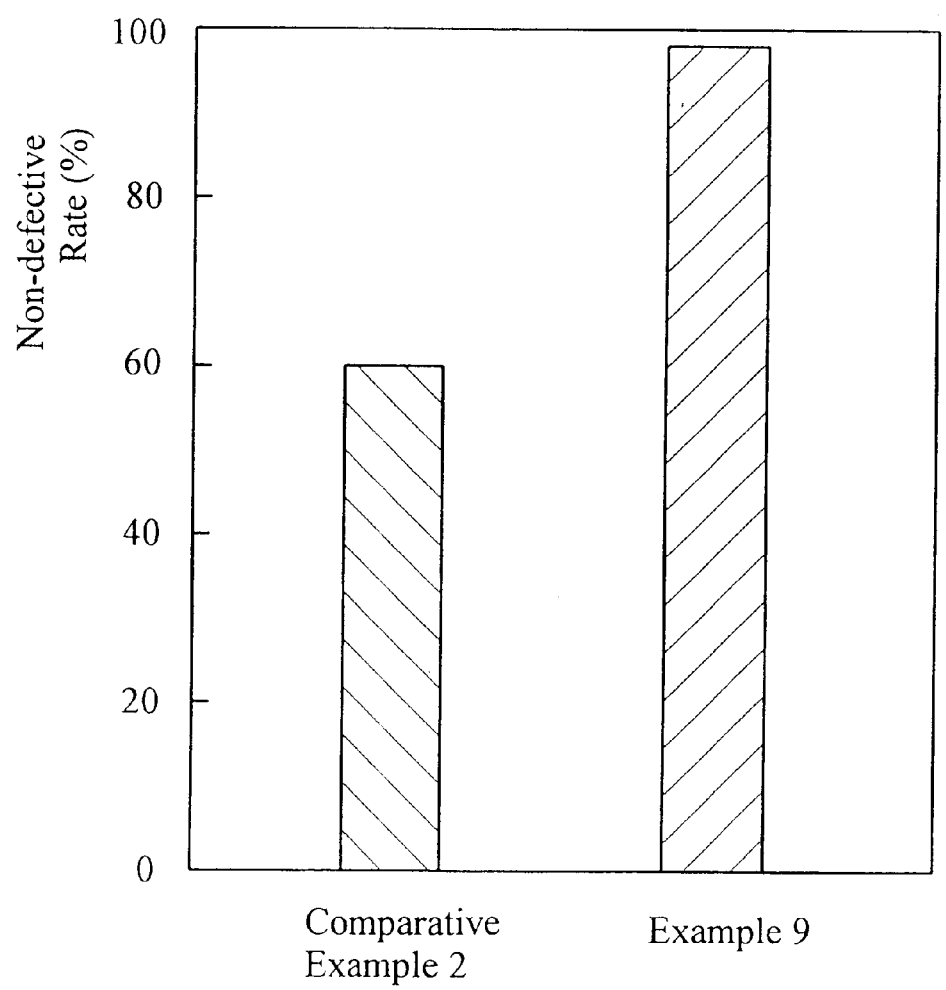
FIG. 36 is a graph indicating the result of the examination of TZDB of single crystal wafers manufactured from a single crystal obtained in the Example 9.

FIG. 36 is a graph indicating the result of the examination of TZDB of single crystal wafers manufactured from a single crystal obtained in the Example 9 (the position r of the R-OSF 42=(1/3)R). Here, the mean non-defective rate in the case where the oxide film thickness was 25 nm and the electric field of 8 MV/cm was applied was found. As Comparative Example 2, using the conventional apparatus for pulling a single crystal shown in FIG. 1, a single crystal having a diameter of 8 inches, where the R-OSF occurrence position r=(1/3)R, was grown, and the mean non-defective rate of wafers manufactured from the single crystal is also shown. As is obvious from FIG. 36, the non-defective rate of the TZDB in the Comparative Example 2 was 60% or so, while that in the Example 9 was 95% or more.

Example 10

Using the apparatus for pulling a single crystal shown in FIG. 13, a single crystal 6 having a diameter of 8 inches was pulled. At that time, the pulling speed of the single crystal 6 was gradually decreased. Here, the other conditions were the same as those in the Example 7. The distance $h_c$ between the lower end of the straightening vane 11 and the flection 11c was set to 70 mm and the angle θ was set to 45°.

Figure 37:
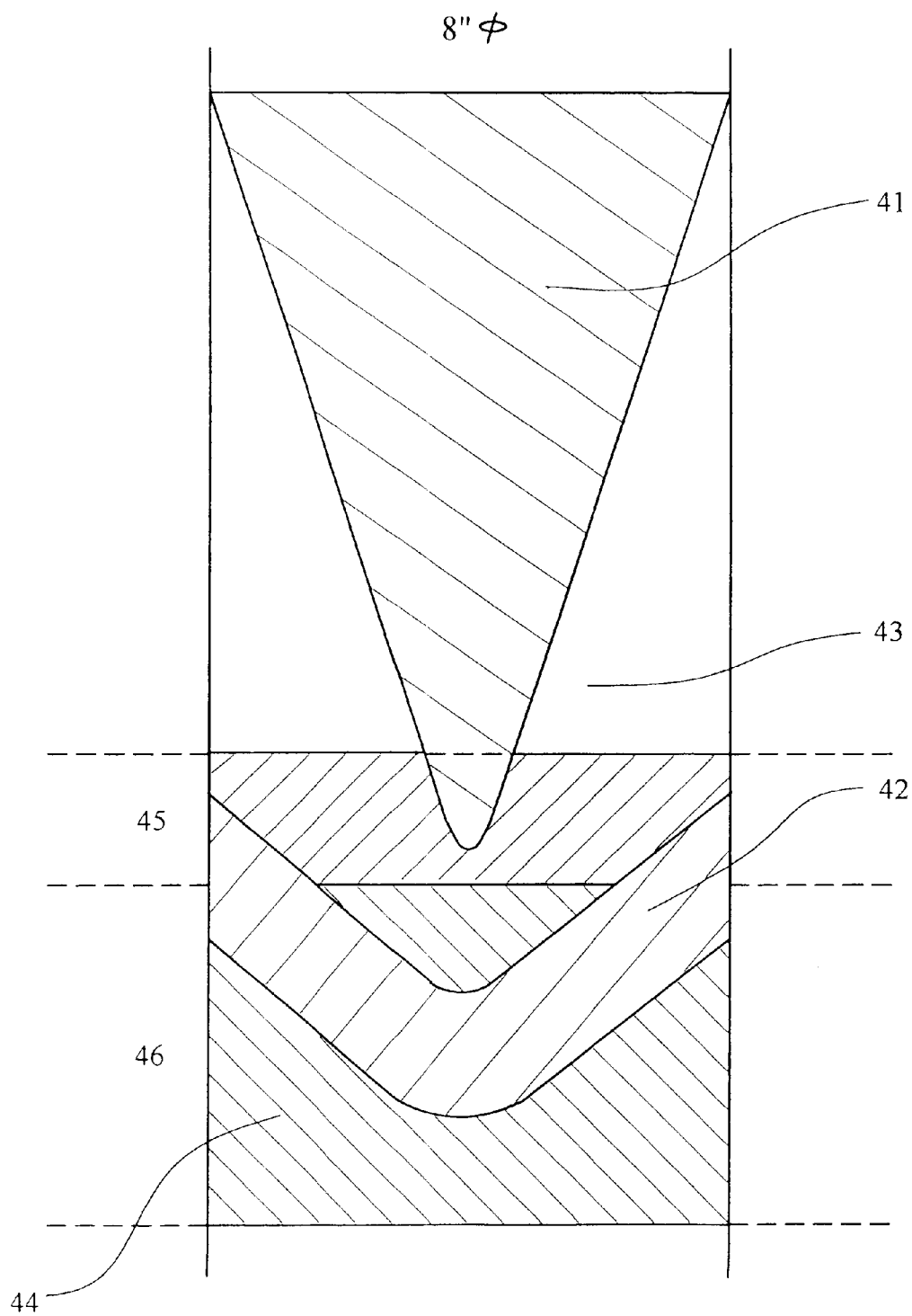
FIG. 37 is a diagram showing the occurrence region of grown-in defects in a single crystal obtained in Example 10.

FIG. 37 is a diagram showing the result from an X-ray topograph taken after a single crystal obtained in the Example 10, which was slivered, was applied with Cu, and was heat treated at 900° C. so as to distinguish each grown-in defect region. Compared with a crystal obtained in the Example 9 (see FIG. 33), it was ascertained that the region of the R-OSF 42 became a gentle convex downward and that the region 45 having a low density of grown-in defects and the region 46 wherein no grown-in defects were generated spread within the crystal plane. Accordingly, it became clear that it is possible to make the density of the grown-in defect region still lower and to increase the region wherein no grown-in defects are generated by growing a crystal at appropriate pulling speeds.

Here, the cases of the crystals having a diameter of 6 or 8 inches were described, but the present invention is theoretically effective even concerning crystals having larger diameters (e.g. diameters of 12 inches or more). Since the quality of wafers is made higher by improving the temperature gradient inside a crystal, the present invention can be performed in the similar manner even when the magnetic-field-applied CZ (MCZ) method which affects the flux state of the melt is applied.

INDUSTRIAL APPLICABILITY

This invention can be used as an apparatus for pulling a silicon single crystal used as a semiconductor material in its low defect density state.

What is claimed is:

1. An apparatus for pulling a single crystal, comprising:
   a crucible to be charged with a melt;
   a heater arranged around said crucible;
   a straightening vane, shaped as a side surface of an inverted truncated cone or a cylinder, to surround a pulled single crystal and having a lower end portion to be located above the surface of the melt when the melt is in said crucible; and
   a ring-shaped heat shield plate fitted to or spaced from an inner wall surface or an outer wall surface of said straightening vane at a position above said lower end portion of said straightening vane, wherein the distance between a bottom surface of said ring-shaped heat shield plate and the surface of the melt, when the melt is in said crucible, is within the range of from 30 mm to 200 mm.

2. The apparatus according to claim 1, further comprising a heat insulator embedded in an upper portion of said straightening vane at a position above said ring-shaped heat shield plate.

3. The apparatus according to claim 2, wherein an inner diameter of said ring-shaped heat shield plate is greater than an outer diameter of a single crystal to be pulled when said ring-shaped heat shield plate is fitted to the inner wall surface of said straightening vane.

4. The apparatus according to claim 3, further comprising a cooling tube, to surround the pulled single crystal, positioned above said straightening vane.

5. The apparatus according to claim 2, wherein said ring-shaped heat shield plate has an outer diameter that is less than an inner diameter of said crucible when said ring-shaped heat shield plate is fitted to the outer wall surface of said straightening vane.

6. The apparatus according to claim 5, further comprising a cooling tube, to surround the pulled single crystal, positioned above said straightening vane.

7. The apparatus according to claim 2, further comprising a cooling tube, to surround the pulled single crystal, positioned above said straightening vane.

8. The apparatus according to claim 1, wherein said ring-shaped heat shield plate has an outer diameter that is less than an inner diameter of said crucible when said ring-shaped heat shield plate is fitted to the outer wall surface of said straightening vane.

9. The apparatus according to claim 8, further comprising a cooling tube, to surround the pulled single crystal, positioned above said straightening vane.

10. The apparatus according to claim 1, further comprising a cooling tube, to surround the pulled single crystal, positioned above said straightening vane.

11. An apparatus for pulling a single crystal, comprising:
    a crucible to be charged with a melt;
    a heater arranged around said crucible;
    a straightening vane, shaped as a side surface of an inverted truncated cone or a cylinder, to surround a pulled single crystal and having a lower end portion to be located above the surface of the melt when the melt is in said crucible;
    a ring-shaped heat shield plate fitted to or spaced from an inner wall surface or an outer wall surface of said straightening vane at a position above said lower end portion of said straightening vane; and
    a heat insulator embedded in an upper portion of said straightening vane at a position above said ring-shaped heat shield plate.

12. The apparatus according to claim 11, wherein an inner diameter of said ring-shaped heat shield plate is greater than an outer diameter of a single crystal to be pulled when said ring-shaped heat shield plate is fitted to the inner wall surface of said straightening vane.

13. The apparatus according to claim 12, further comprising a cooling tube, to surround the pulled single crystal, positioned above said straightening vane.

14. The apparatus according to claim 11, wherein said ring-shaped heat shield plate has an outer diameter that is less than an inner diameter of said crucible when said ring-shaped heat shield plate is fitted to the outer wall surface of said straightening vane.

15. An apparatus for pulling a single crystal, comprising:
    a crucible to be charged with a melt and having an inner diameter;
    a heater arranged around said crucible;
    a straightening vane, shaped as a side surface of an inverted truncated cone or a cylinder, to surround a pulled single crystal and having a lower end portion to be located above the surface of the melt when the melt is in said crucible; and
    a ring-shaped heat shield plate fitted to or spaced from an inner wall surface or an outer wall surface of said straightening vane at a position above said lower end portion of said straightening vane, with said ring-shaped heat shield plate having an outer diameter that is less than the inner diameter of said crucible when said ring-shaped heat shield plate is fitted to the outer wall surface of said straightening vane.

16. An apparatus for pulling a single crystal, comprising:
    a crucible to be charged with a melt and having an inner diameter;
    a heater arranged around said crucible;
    a straightening vane, shaped as a side surface of an inverted truncated cone or a cylinder, to surround a pulled single crystal and having a lower end portion to be located above the surface of the melt when the melt is in said crucible;
    a ring-shaped heat shield plate fitted to or spaced from an inner wall surface or an outer wall surface of said straightening vane at a position above said lower end portion of said straightening vane; and
    a cooling tube, to surround the pulled single crystal, positioned above said straightening vane.

17. An apparatus for pulling a single crystal, comprising:
    a crucible to be charged with a melt and having an inner diameter;
    a heater arranged around said crucible;
    a straightening vane, shaped as a side surface of an inverted truncated cone or a cylinder, to surround a pulled single crystal and having a lower end portion to be located above the surface of the melt when the melt is in said crucible; and a ring-shaped heat shield plate fitted to or spaced from an inner wall surface or an outer wall surface of said straightening vane at a position above said lower end portion of said straightening vane, with an inner diameter of said ring-shaped heat shield plate being greater than an outer diameter of a single crystal to be pulled when said ring-shaped heat shield plate is fitted to the inner wall surface of said straightening vane.

* * * * *